(12) United States Patent
Yada et al.

(10) Patent No.: US 8,547,702 B2
(45) Date of Patent: Oct. 1, 2013

(54) MULTI-PIECE BOARD AND METHOD FOR MANUFACTURING THE SAME

(75) Inventors: Takahiro Yada, Ogaki (JP); Takahiro Yamazaki, Ogaki (JP); Sumiki Muto, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 426 days.

(21) Appl. No.: 12/793,170

(22) Filed: Jun. 3, 2010

(65) Prior Publication Data

US 2011/0096517 A1    Apr. 28, 2011

Related U.S. Application Data

(60) Provisional application No. 61/254,970, filed on Oct. 26, 2009.

(51) Int. Cl.
*H05K 5/00* (2006.01)
(52) U.S. Cl.
USPC .......................................................... 361/752
(58) Field of Classification Search
USPC ......... 361/752, 784, 796; 174/259; 428/172; 257/758; 29/830
See application file for complete search history.

(56) References Cited

U.S. PATENT DOCUMENTS

2010/0101844 A1* 4/2010 Hasegawa ..................... 174/259

FOREIGN PATENT DOCUMENTS

| JP | 64-048489 | 2/1989 |
|---|---|---|
| JP | 8-241627 | 9/1996 |
| JP | 09-172232 | 6/1997 |
| JP | 11-307905 | 11/1999 |
| JP | 2002-289986 | 10/2002 |
| JP | 2005-38953 | 2/2005 |
| JP | 2005-322878 | 11/2005 |
| JP | 2007-115855 | 5/2007 |
| JP | 2007-180079 | 7/2007 |

* cited by examiner

*Primary Examiner* — Jeremy Norris
*Assistant Examiner* — Tremesha S Willis
(74) *Attorney, Agent, or Firm* — Oblon, Spivak, McClelland, Maier & Neustadt, L.L.P.

(57) ABSTRACT

A multi-piece board includes a frame and multiple wiring boards connected to the frame. The frame and each of the wiring boards are positioned with a clearance. The frame and/or each of the wiring boards has an end portion having a first notch portion on a surface side adjacent to the clearance. The end portion of the frame and/or each of the wiring boards has a second notch portion formed on the opposite surface side with respect to the surface side of the first notched portion adjacent to the clearance. The clearance between the frame and each of the wiring boards is filled with an adhesive agent.

20 Claims, 40 Drawing Sheets

MULTI-PIECE BOARD AND METHOD FOR MANUFACTURING THE SAME

CROSS-REFERENCE TO RELATED APPLICATIONS

The present application claims the benefits of priority to U.S. Application No. 61/254,970, filed Oct. 26, 2009. The contents of that application are incorporated herein by reference in their entirety.

BACKGROUND OF THE INVENTION

1. Field of the Invention

The present invention relates to a multi-piece board having frames (frame sections) and wiring boards (piece sections) connected to the frames, and its manufacturing method.

2. Discussion of the Background

In Japanese Laid-Open Patent Application No. 2002-289986, a multi-piece board is described in which a frame section and a piece section are separately formed and are adhered later. In Japanese Laid-Open Patent Application No. 2005-38953, a method is described for bonding a piece section and a frame section by filling an adhesive agent in a hole with a bottom at the bonded section. In Japanese Laid-Open Patent Application No. 2005-322878, a structure is described where an adhesive agent is filled in a cavity between a protruding portion of a unit sheet and a frame. In Japanese Laid-Open Patent Application No. 2007-180079, a structure is described in which opening portions of a through hole in a substrate are made wider on the upper and lower surfaces. In Japanese Laid-Open Patent Application No. H8-241627, a structure is described in which multiple circuit-pattern conductors are mechanically bonded with insulative resin. The contents of Japanese Laid-Open Patent Application Nos. 2002-289986, 2005-38953, 2005-322878, 2007-180079 and H8-241627 are incorporated herein by reference in their entirety in the present application. Also, the contents of Japanese Patent Application No. 2008-276169 are incorporated herein by reference in their entirety in the present application.

SUMMARY OF THE INVENTION

According to one aspect of the present invention, a multi-piece board includes a frame and multiple wiring boards connected to the frame. The frame and each of the wiring boards are positioned with a clearance. The frame and/or each of the wiring boards has an end portion having a first notch portion on a surface side adjacent to the clearance. The end portion of the frame and/or each of the wiring boards has a second notch portion formed on the opposite surface side with respect to the surface side of the first notched portion adjacent to the clearance. The clearance between the frame and each of the wiring boards is filled with an adhesive agent.

According to another aspect of the present invention, a method for manufacturing a multi-piece board includes positioning a frame and a wiring board with a clearance, forming a first notch portion in an end portion of the frame and/or the wiring board on a surface side adjacent to the clearance, forming a second notch portion in the end portion of the frame and/or the wiring board on the opposite surface side with respect to the surface side of the first notch portion adjacent to the clearance, and injecting an adhesive agent from the first notch portion into the clearance between the frame and the wiring board.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
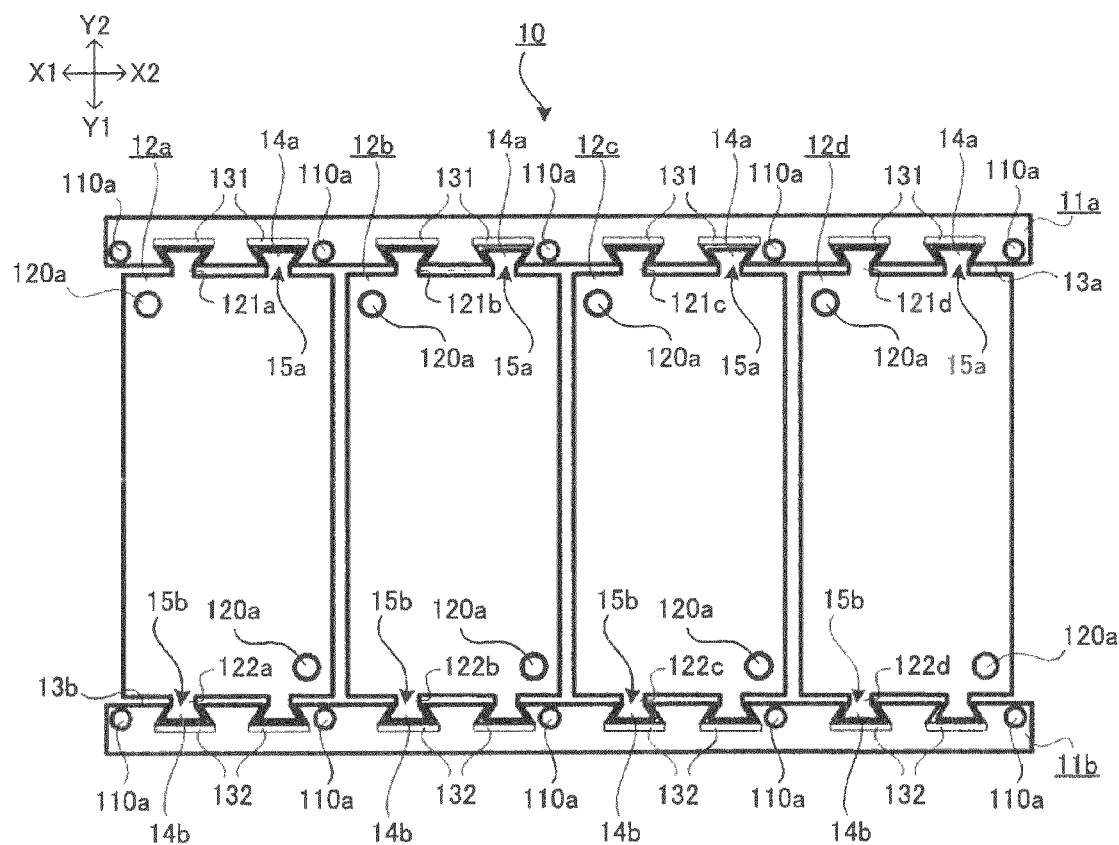
FIG. 1 is a plan view showing a multi-piece board of an embodiment of the present invention viewed from a second-surface side.

The embodiments will now be described with reference to the accompanying drawings, wherein like reference numerals designate corresponding or identical elements throughout the various drawings.

In the drawings, arrows (X1, X2, Y1, Y2, Z1, Z2) indicate six directions relating to three axes (XYZ axes) perpendicular to each other. Arrows (Z1, Z2) each indicate a lamination direction in a wiring board, corresponding to a direction along a normal line (or a direction of the thickness of a core substrate) to the main surfaces (upper and lower surfaces) of the wiring board. The main surfaces of a wiring board are on the X-Y plane. The X directions correspond to the directions in which piece sections are positioned. The Y directions correspond to the directions in which frame sections and piece sections are joined.

In the present embodiment, two main surfaces, facing normal lines in opposite directions, are referred to as a first surface (arrow-Z1 side surface) and a second surface (arrow-Z2 side surface). In a lamination direction, a side closer to a core is referred to as a lower layer (or an inner-layer side), and a side farther from the core as an upper layer (or an outer-layer side). A layer including a conductive pattern that functions as wiring such as a circuit is referred to as a wiring layer. In such a wiring layer, other than the conductive pattern, a through-hole conductor or a land of a via conductor may be included. A "width" indicates a diameter if it is a circle, and if it is not a circle, the width indicates $\sqrt{(2 \times \text{cross section}/\pi)}$. If a hole or a projection tapers, by comparing average values or the like, "widths" of two or more holes or projections are determined to be the same or different.

As shown in FIG. 1, multi-piece board 10 of the present embodiment has frame sections (11a, 11b) and piece sections (12a, 12b, 12c, 12d).

Frame sections (11a, 11b) are each made of, for example, a double-sided copper-clad laminate. However, they are not limited to such. For example, a wiring board formed by alternately laminating a predetermined number of conductive layers and insulation layers on a double-sided copper-clad laminate (core substrate) may also be used. In addition, a substrate formed by laminating and thermopressing multiple sheets of semi-cured base material, a so-called prepreg, may also be used. Frame sections (11a, 11b) are structured to be two long and narrow bars sandwiching a series of piece sections (12a-12d), for example. However, frame sections (11a, 11b) are not limited to such a configuration. Frame sections (11a, 11b) may be structured in any type, for example, parallelogram, circular or elliptic frames surrounding piece sections (12a-12d).

In each of frame sections (11a, 11b), multiple holes (110a) are formed at a predetermined distance. Such holes (110a) are used as alignment marks during the manufacturing process. Also, such holes are used to prevent shifting when router processing is conducted on the panel to separate it into units (piece sections 12a-12d).

Piece sections (12a-12d) are made of rectangular rigid wiring boards, for example. Such rigid wiring boards are, for example, six-layer wiring boards containing circuits for electronic components. However, piece sections (12a-12d) are not limited to rigid wiring boards, and may be made of flexible wiring boards, flex-rigid wiring boards or the like. Also, they are not limited to multilayer boards, and double-sided wiring boards or single-sided wiring boards may be used. Moreover, the configuration and thickness of piece sections (12a-12d) are not limited specifically. For example, parallelogram, circular or elliptic configurations may also be employed. In addition, the number of layers may be smaller than six (such as a single layer) or greater than six (such as eight layers). Such piece sections (12a-12d) are separated from frame sections (11a, 11b) and installed in a cell phone or the like, for example. In the present embodiment, piece sections (12a-12d) have the same structure as each other. However, piece sections (12a-12d) are not limited to such, and may have different structures from each other.

As described above, in the present embodiment, frame sections (11a, 11b) and piece sections (12a-12d) are made of wiring boards with a different number of layers. However, the present invention is not limited to such, and frame sections (11a, 11b) and piece sections (12a-12d) may be combined in any other way.

In each of piece sections (12a-12d), multiple alignment patterns (120a) are formed. Alignment patterns (120a) are made of copper pads formed by etching copper film, for example, or gold pads formed by performing NiAu plating on such copper pads. Alignment patterns (120a) are positioned, for example, diagonally on piece sections (12a-12d). Such alignment patterns (120a) are used for alignment when manufacturing multi-piece board 10, for example. Instead of alignment patterns (120a), holes may also be used. Alignment patterns (120a) may be arranged in any position.

Piece section (12a) has bridges (121a, 122a) (two each on the arrow-Y2 side and the arrow-Y1 side); piece section (12b) has bridges (121b, 122b) (two each on the arrow-Y2 side and the arrow-Y1 side); piece section (12c) has bridges (121c, 122c) (two each on the arrow-Y2 side and the arrow-Y1 side); and piece section (12d) has bridges (121d, 122d) (two each on the arrow-Y2 side and the arrow-Y1 side). Bridges (121a-121d, 122a-122d) are formed, for example, at the four corners of piece sections (12a-12d). However, the number of bridges (121a-121d, 122a-122d) is not limited specifically. For example, bridges (121a-121d, 122a-122d) may be formed one each on the top and bottom, or three each on the top and bottom, in each of piece sections (12a-12d). Moreover, the number of bridges on the top and bottom may be different, such as one on the top and two on the bottom.

Each bridge (121a-121d) has joint portion (14a) at its tip; and each bridge (122a-122d) has joint portion (14b) at its tip. Joint portions (14a, 14b) protrude from piece sections (12a-12d) in directions Y (the directions in which frame sections (11a, 11b) and piece sections (12a-12d) are joined). The planar shape of joint portions (14a, 14b) (protruding portions) is trapezoidal with its width increasing toward the tip. On the other hand, frame sections (11a, 11b) have joint portions (15a, 15b) in positions respectively corresponding to joint portions (14a, 14b). Joint portions (15a, 15b) are recessed in frame sections (11a, 11b) in directions Y. The planar shape of joint portions (15a, 15b) (cavities) is trapezoidal corresponding to the trapezoidal planar shape of joint portions (14a, 14b). Joint portions (14a, 15a) function as joint members of frame section (11a) and piece sections (12a-12d); and joint portions (14b, 15b) function as joint members of frame section (11b) and piece sections (12a-12d). Joint portions (14a, 14b) and joint portions (15a, 15b) may be structured in any shape (for details, see FIGS. (43-45) described later).

By joining frame section (11a) and piece sections (12a-12d), slits (13a) are formed between them except in areas of bridges (121a-121d). Also, by joining frame section (11b) and piece sections (12a-12d), slits (13b) are formed between them except in areas of bridges (122a-122d). Namely, frame section (11a) and piece sections (12a, 12b, 12c, 12d) are joined by bridges (121a, 121b, 121c, 121d) respectively. Also, frame section (11b) and piece sections (12a, 12b, 12c, 12d) are joined by bridges (122a, 122b, 122c, 122d) respectively.

Figure 2A:
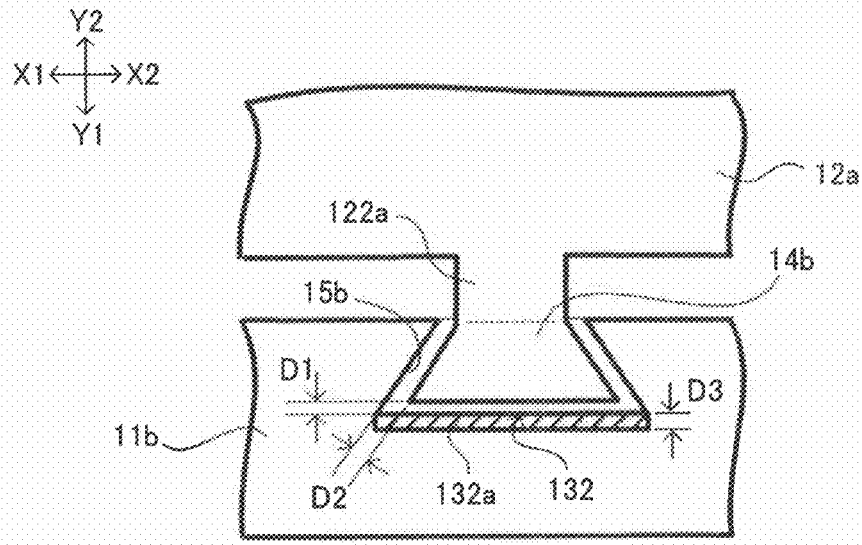
FIG. 2A is a magnified view partially showing a second surface of a first joint portion of a multi-piece board.
Figure 2B:
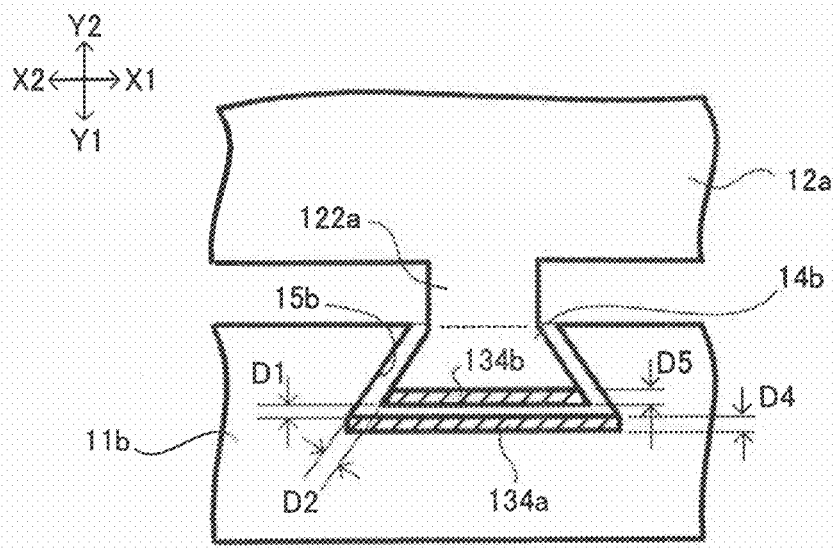
FIG. 2B is a magnified view partially showing a first surface of the first joint portion of a multi-piece board.
Figure 3:
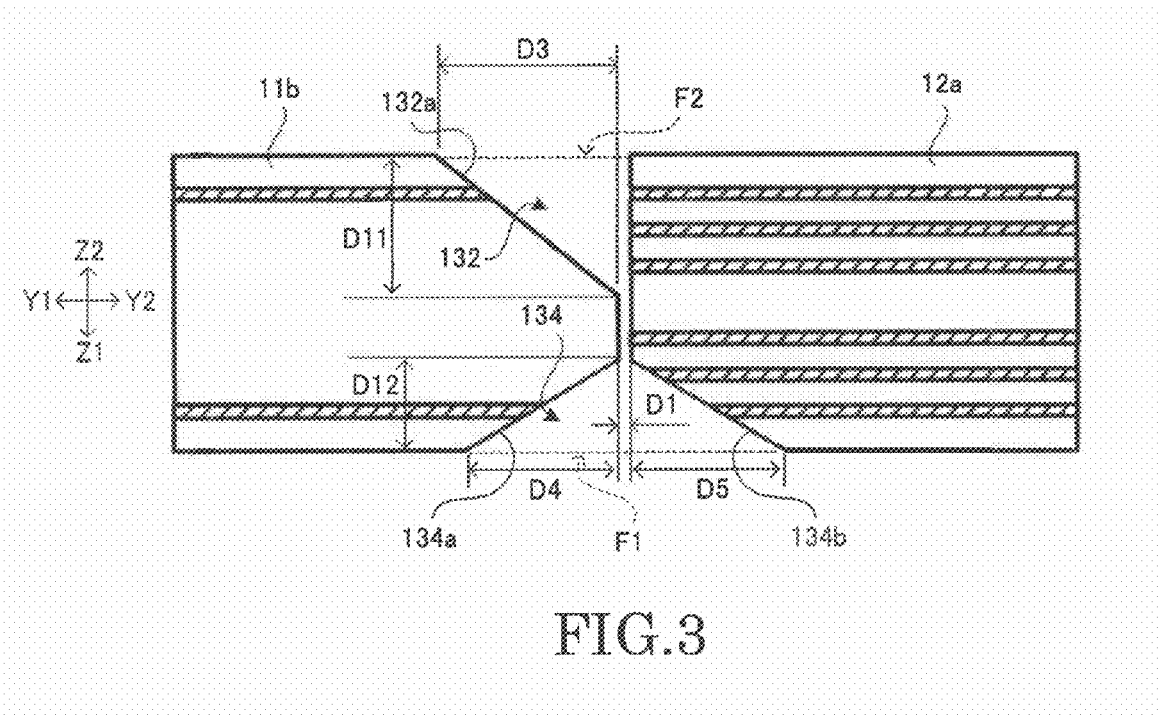
FIG. 3 is a cross-sectional view showing a first joint portion of a multi-piece board in a state in which an adhesive agent is not filled.

FIG. 2A is a magnified view partially showing the second surface of a joint portion in multi-piece board 10, and FIG. 2B is a magnified view partially showing the first surface of a joint portion in multi-piece board 10. FIG. 3 is a cross-sectional view of a joint portion of multi-piece board 10. For convenience in providing a description, FIGS. 2A, 2B and 3) each show a state before adhesive agent 16 (FIG. 4) is filled in cavity 132 (receptor).

Joint portion (15b) of frame section (11b) and joint portion (14b) of piece section (12a) are arranged with predetermined clearances (D1, D2), as shown in FIGS. 2A, 2B). Clearance (D1) is formed on the arrow-Y1 side of joint portion (14b), and clearance (D2) is formed on the arrow-X1 side and the arrow-X2 side of joint portion (14b). (D1) is set approximately at 0 μm-500 μm, for example; it is especially preferred to be set at 30-100 μm. Also, the same as (D1), (D2) is set approximately at 0 μm-500 μm, for example; it is especially preferred to be set at 30-100 μm.

On the second-surface side of an end portion (the end portion on the arrow-Y2 side) of frame section (11b), notch portion (132a) (first notch portion) is formed as shown in FIG. 2A. The notched surface is slanted, for example. Width (D3) of notch portion (132a) is preferred to be set at 400 μm-1 mm. In addition, as shown in FIG. 2B, on the first-surface side of an end portion (the end portion on the arrow-Y2 side) of frame section (11b), notch portion (134a) (second notch portion) is formed. The notched surface is slanted, for example. Width (D4) of notch portion (134a) is set approximately at 0 μm-2 mm, for example; it is especially preferred to be set at 100 μm-500 μm. Also, on the first-surface side of an end portion (the end portion on the arrow-Y1 side) of piece section (12a), notch portion (134b) (second notch portion) is formed. The notched surface is slanted, for example. Width (D5) of notch portion (134b) is set approximately at 0 μm-2 mm; it is especially preferred to be set at 100 μm-500 μm.

As shown in FIG. 3, frame section (11b) and piece section (12a) are positioned opposite each other with predetermined clearance (D1). Then, at an end portion of frame section (11b) and at an end portion of piece section (12a) which face each other, notch portion (132a) is formed on the second-surface side of the end portion of frame section (11b), and notch portions (134a, 134b) are formed on the first-surface side of the end portions of frame section (11b) and piece section (12a). By positioning frame section (11b) and piece section (12a) opposite each other while sandwiching notch portion (132a), cavity 132 (receptor) is formed between them by notch portion (132a) and the wall surface of piece section (12a). Also, on the first-surface side, cavity 134 is formed by notch portion (134a) and notch portion (134b). Cavity 132, clearance (D1) and cavity 134 are set to be contiguous.

Cavity 132 is a groove having opening surface (F2) on either the upper or lower surface (arrow-Z2 side). Cavity 134 is a groove having opening surface (F1) on either the upper or lower surface (arrow-Z1 side). The width of cavity 132 increases toward the second-surface side, and the width of cavity 134 increases toward the first-surface side. Cavities (132, 134) do not penetrate through the body of frame section (11b). The lengths of cavities (132, 134) (measurements in directions-X) correspond to the trapezoidal bottom surface of joint portion (15b). Depth (D11) of cavity 132 is preferred to be set approximately at 200 μm-600 μm, depending on the board thickness of the base material. Depth (D12) of cavity 134 is preferred to be set approximately at 50 μm-200 μm, depending on the board thickness of the base material.

Figure 4:
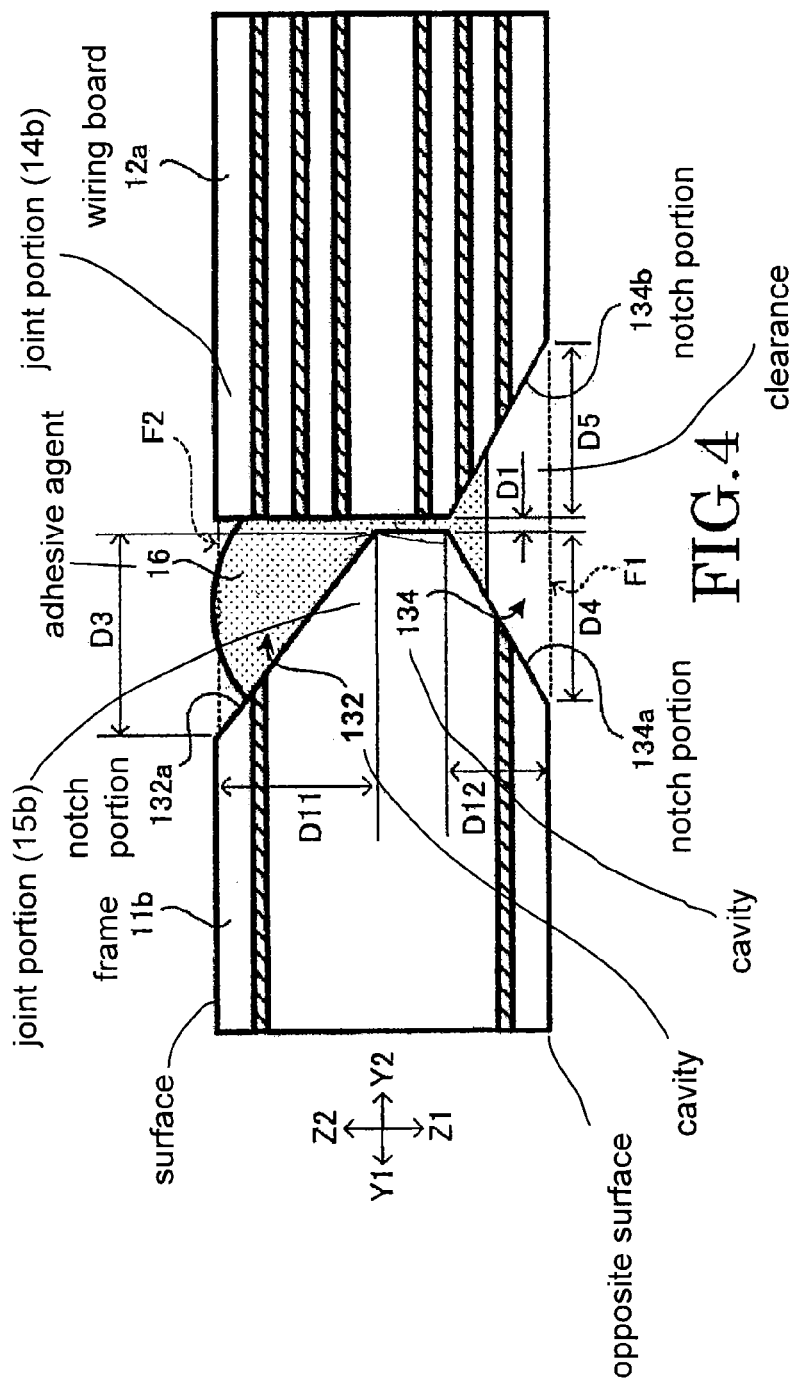
FIG. 4 is a cross-sectional view showing the first joint portion of a multi-piece board in a state in which an adhesive agent is filled.

As shown in FIG. 4, in clearance (D1) between frame section (11b) and piece section (12a), adhesive agent 16 is injected from the second-surface side (cavity 132). Accordingly, adhesive agent 16 is filled in clearance (D1). During that time, adhesive agent 16 flows out from clearance (D1) toward cavity 134. However, since notch portions (134a, 134b) are formed on the first-surface side of frame section (11b) and piece section (12a), adhesive agent 16 is suppressed from seeping out (spilling) to the first-surface side. Moreover, since notch portions (134a, 134b) are formed both in frame section (11b) and piece section (12a), the above effect is remarkable.

Figure 5A:
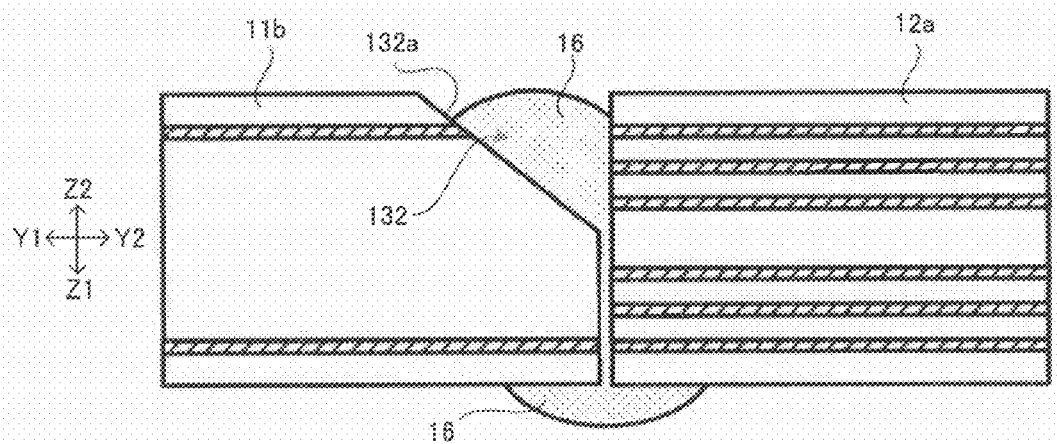
FIG. 5A is a view showing a first comparative example.

More specifically, in a case where notch portions (134a, 134b) are not formed, for example, as shown in FIG. 5A, adhesive agent 16 tends to seep out. As for the reasons, effects not only from gravity but also from capillarity are assumed. In the experiments conducted by the inventors, it is confirmed that seeping of adhesive agent 16 likely occurs, regardless of the degrees of viscosity or thixotropy of adhesive agent 16.

Based on the results of the above experiment or the like, in multi-piece board 10 of the present embodiment, the width of cavity 134 is made to increase toward the first-surface side. Moreover, since notch portions (134a, 134b) are formed in both frame section (11b) and piece section (12a), the degree to which the width increases is greater. Accordingly, in multi-piece board 10, adhesive agent 16 is suppressed from spilling due to capillarity. As a result, seeping of adhesive agent 16 to the first-surface side may likely be suppressed.

Figure 5B:
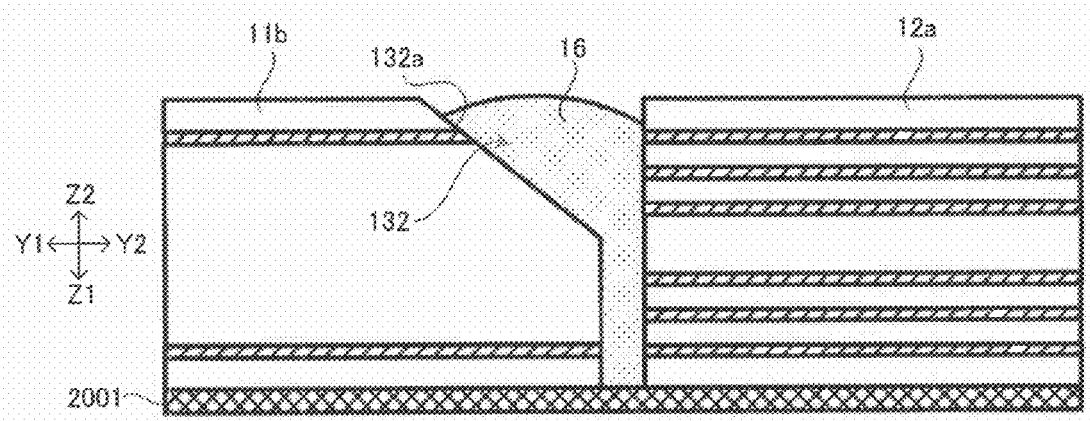
FIG. 5B is a view showing a second comparative example.

Alternatively, to prevent adhesive agent 16 from spilling, an option is to arrange tape 2001 on the first-surface side as shown in FIG. 5B. However, in such a case, a step to paste tape 2001 and a step to remove tape 2001 are required, and there is a concern that the production take time will become longer and costs will increase. In multi-piece board 10 of the present embodiment, since such tape 2001 or the like is not required, low costs and high productivity are achieved.

In multi-piece board 10 of the present embodiment, adhesive agent 16 is injected in cavity 132. Adhesive agent 16 flows into other clearances and is filled in each clearance. By adhesive agent 16 filled between frame section (11b) and piece section (12a) and then cured, frame section (11b) and piece section (12a) are joined and secured (adhered). By having notch portions (134a, 134b) formed in frame section (11b) and piece section (12a), while the adhesive agent is suppressed from seeping out (spilling), sufficient connection strength and high connection reliability may be achieved in the connected portion between frame section (11b) and piece section (12a).

Figure 6:
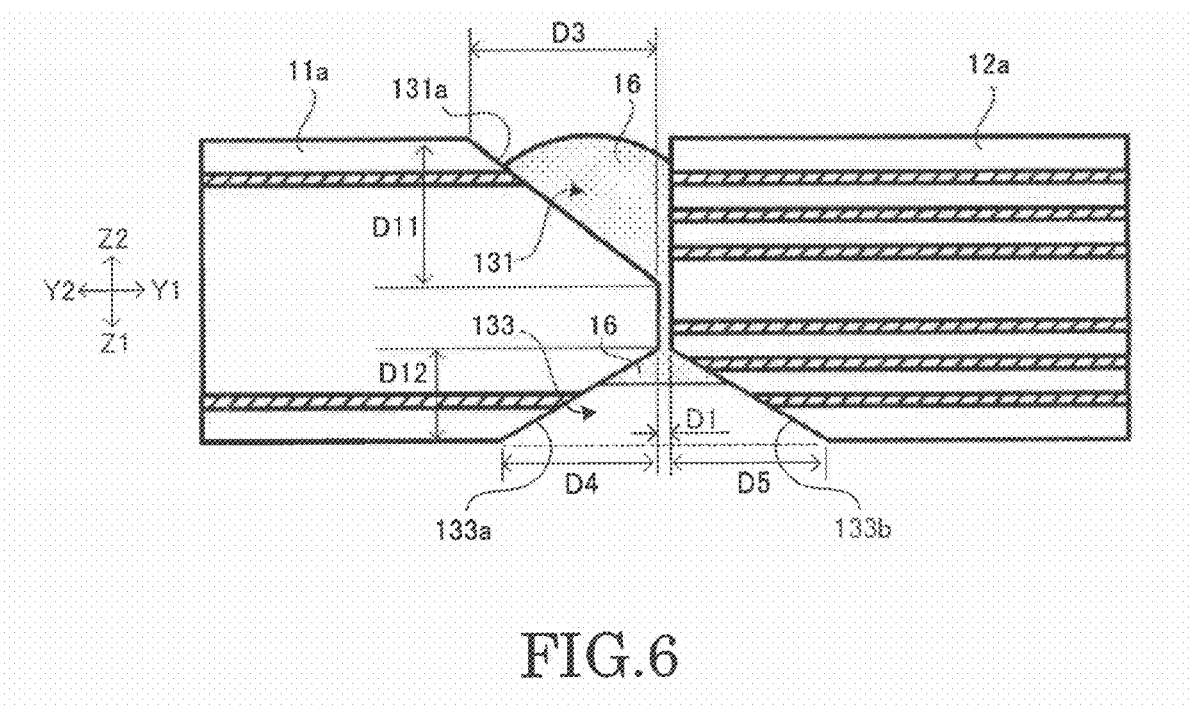
FIG. 6 is a cross-sectional view showing a second joint portion of a multi-piece board in a state in which an adhesive agent is filled.

FIGS. (2A, 2B) show only the structure on the side of frame section (11b), but the structure on the side of frame section (11a) is the same. Namely, as shown in FIG. 6, frame section (11a) and piece section (12a) are positioned opposite each other with predetermined clearance (D1). Then, at the end portion of frame section (11a) and the end portion of piece section (12a) that face each other, notch portion (131a) (first notch portion) is formed on the second-surface side of the end portion of frame section (11a) (the end portion on the arrow-Y1 side), notch portion (133a) (second notch portion) is formed on the first-surface side of the end portion of frame section (11a) (the end portion on the arrow-Y1 side), and notch portion (133b) (second notch portion) is formed on the first-surface side of the end portion of piece section (12a) (the end portion on the arrow-Y2 side). By positioning frame section (11a) and piece section (12a) opposite each other while sandwiching notch portion (131a), cavity 131 (receptor) is formed between them by notch portion (131a) and the wall surface of piece section (12a). Also, on the first-surface side, cavity 133 is formed by notch portion (133a) and notch portion (133b). Cavity 131, clearance (D1) and cavity 133 are set to be contiguous. Therefore, on the side of frame section (11a), the above effect to suppress adhesive agent 16 from seeping or the like may also be achieved.

The joint structure of piece sections (12b-12d) is the same as the joint structure of piece section (12a). However, it is not always required to be the same, and piece sections (12a-12d) may have different structures from each other.

In the following, a method for manufacturing a multi-piece board according to the present embodiment is described.

Figure 7:
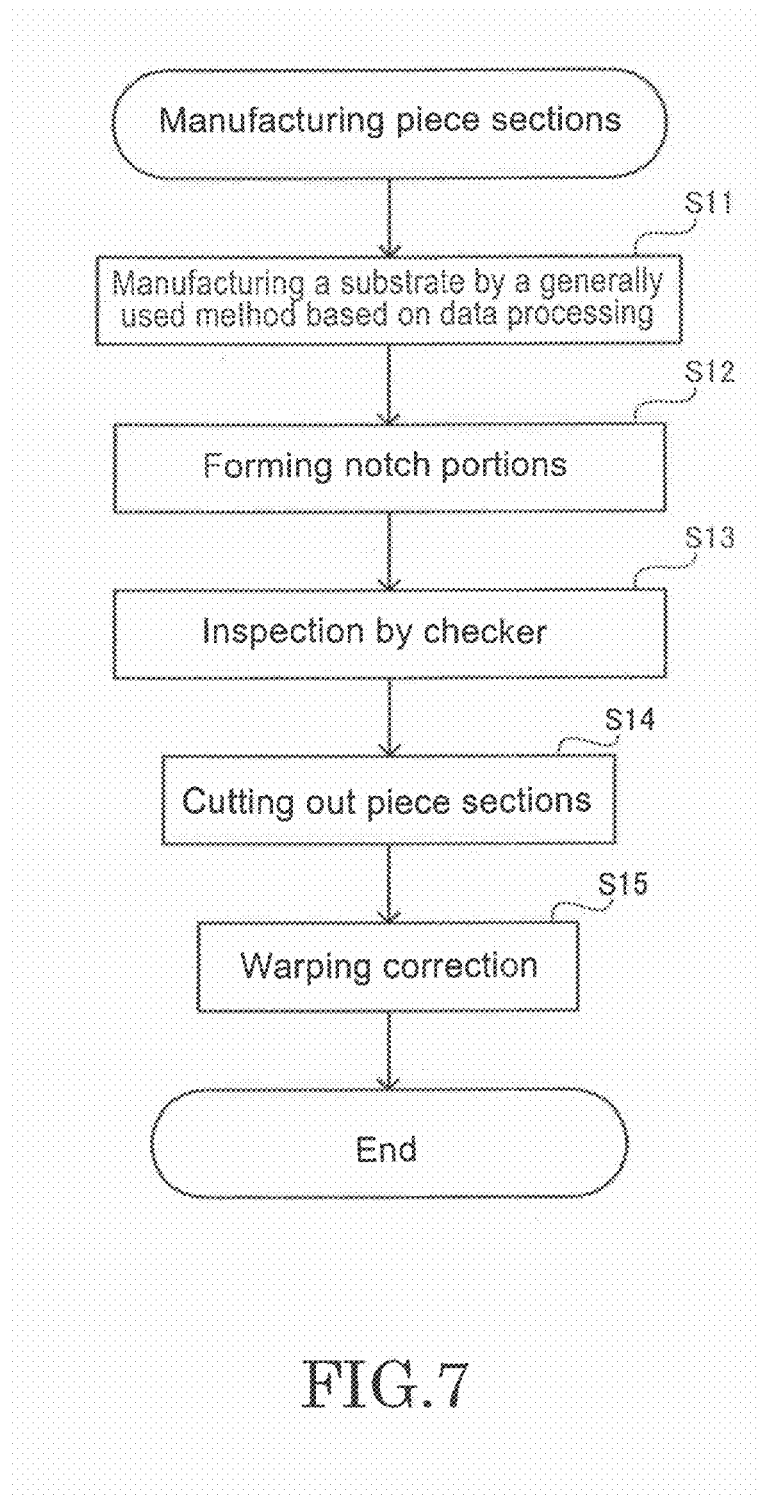
FIG. 7 is a flowchart showing a method for manufacturing a multi-piece board according to the present embodiment, especially showing the order of steps for manufacturing piece sections.

Piece sections (12a-12d) and their bridges (bridges 121a, 122a and others) are manufactured in a procedure such as that shown in FIG. 7. In the present embodiment, since there is no difference in the structures (design data) of piece sections (12a-12d), common piece sections 12 and their bridges (121, 122) are manufactured first. Then, in the later process, they are formed into piece sections (12a-12d) and their bridges (bridges 121a, 122a and others).

Panel 100 (first panel) is prepared in step (S11). Specifically, for example, by processing (data processing) according to the design data, a six-layer laminated wiring board (panel 100) is manufactured. Panel 100 may be manufactured, for example, by a generally used method for manufacturing a laminated wiring board. For example, panel 100 is manufactured by laminating prepreg made by impregnating a base material, for example, non-woven fabric such as glass cloth or aramid fabric, paper or the like with uncured epoxy resin, polyimide resin or phenol resin or the like. Other than such, a laminated board may also be formed by alternately laminating wiring layers and insulation layers on a ceramic base material, for example. The number of layers of panel 100 is not limited specifically.

Figure 8:
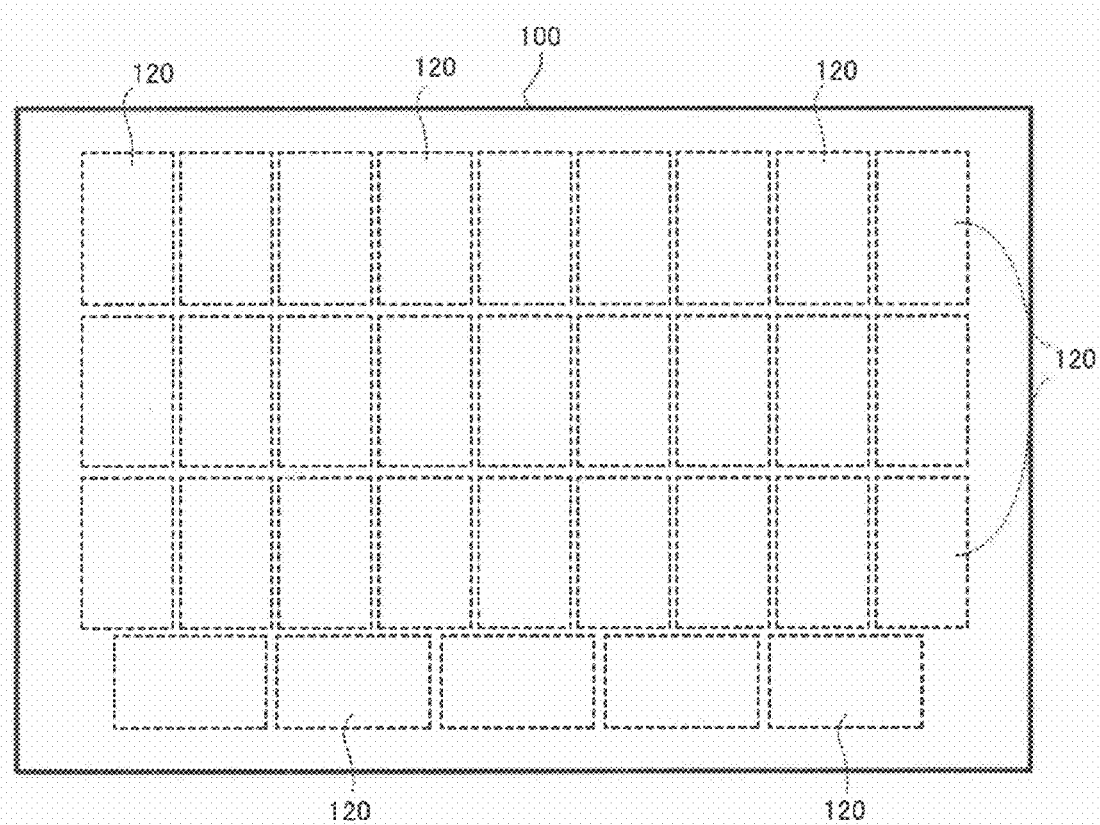
FIG. 8 is a view to illustrate a step for preparing a first panel.

As shown in FIG. 8, a predetermined number of piece boards 120 are included in panel 100. Here, piece board 120 is a laminated board containing only one piece section 12 and its bridges (121, 122). By arranging each piece section 12 as a unit without joining multiple piece sections 12 in panel 100, a piece section may be arranged even in a small space as well. As a result, a greater number of piece sections may be arranged in one panel. The shape of piece board 120 according to the present embodiment is rectangular (see FIG. 8). The external dimensions of such a rectangular board are set to be sufficient for the external dimensions (designed sizes) of piece section 12 and its bridges (121, 122).

Then, according to requirements, NiAu plating or carbon printing may be conducted on panel 100, or holes (not shown in the drawings) to secure the panel during router processing may be formed by X-ray or the like.

Figure 9:
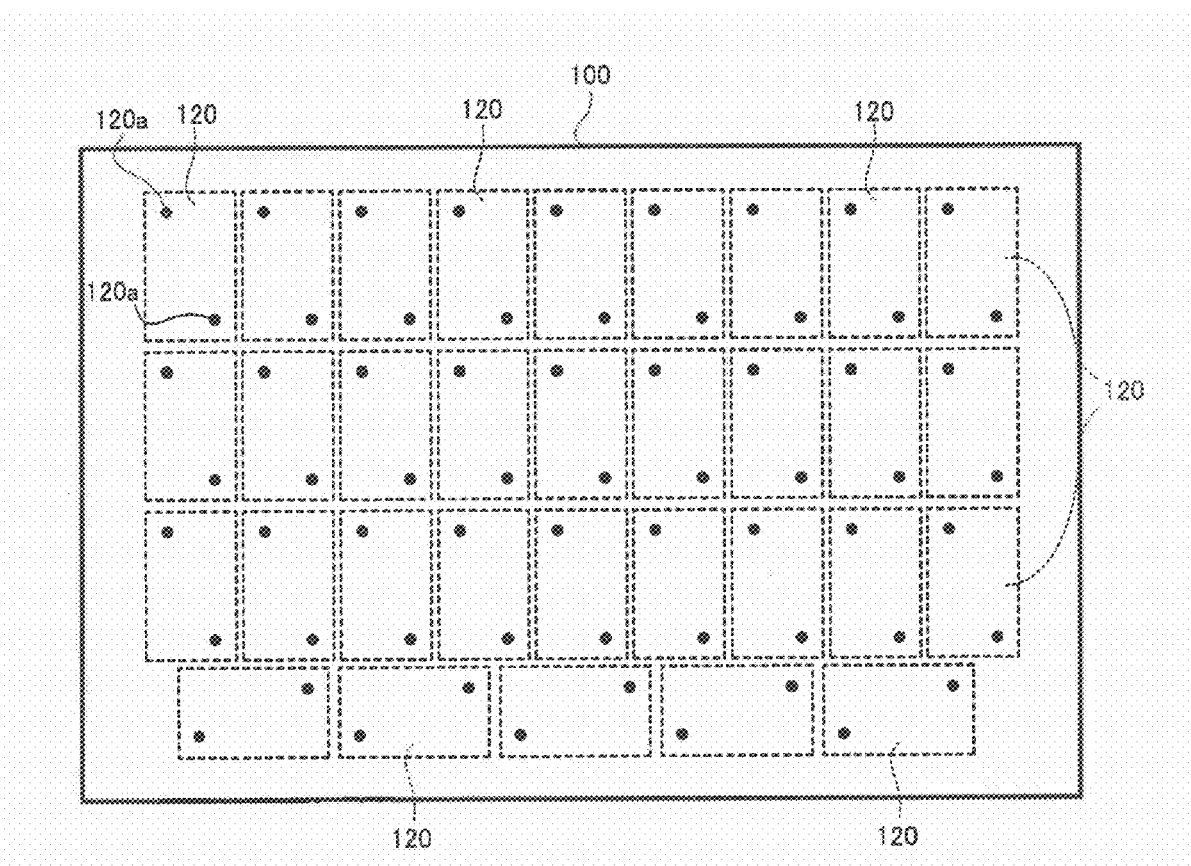
FIG. 9 is a view to illustrate a step for preparing alignment patterns in piece sections.

Then, as shown in FIG. 9, alignment patterns (120a) are formed by etching copper, for example, or performing NiAu plating on copper. Alignment patterns (120a) are formed diagonally at two corners of piece section 12, for example. However, the positions of alignment marks (120a) are not limited to such, and may be set in four corners or in the center of piece section 12, although two diagonally set corners are preferred to be used to accurately determine positions with a smaller number of alignment patterns (120a).

Figure 10:
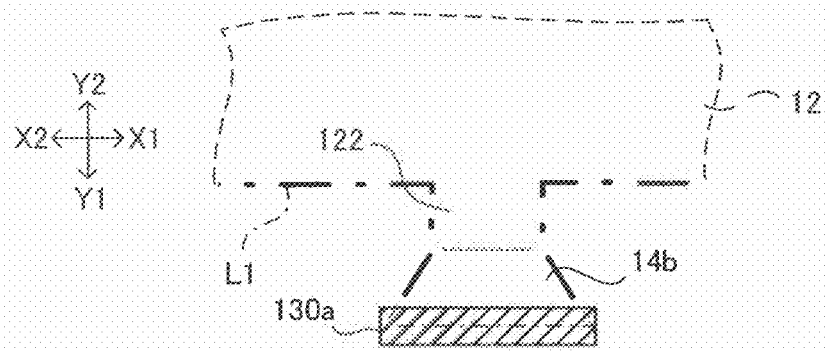
FIG. 10 is a view to illustrate a step for forming a notch portion in a first joint portion.
Figure 11:
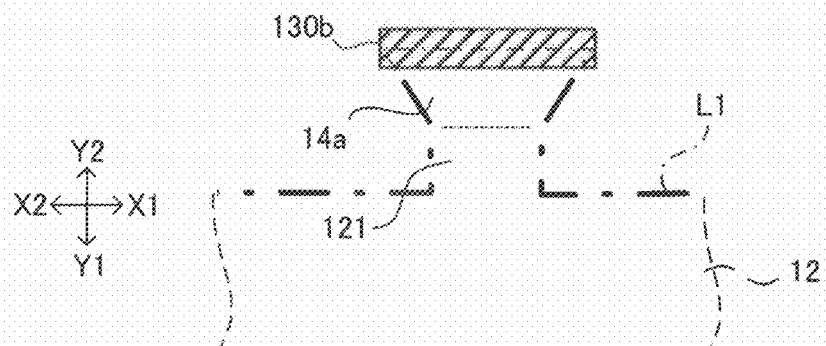
FIG. 11 is a view to illustrate a step for forming a notch portion in a second joint portion.

Next, in step (S12) of FIG. 7, using a router, for example, the panel is dug down to a predetermined depth without penetrating through the panel. Accordingly, as shown in FIG. 10, groove (130a) is formed in the first surface of an end portion of piece section 12 (the arrow-Y1 side), and as shown in FIG. 11, groove (130b) is formed in the second surface of the end portion of piece section 12 (the arrow-Y2 side). Groove (130a) is formed to correspond to notch portion (134b) (FIG. 3), and groove (130b) is formed to correspond to notch portion (133b) (FIG. 6). The width of grooves (130a, 130b) is set to be greater than (D5) (FIGS. 3, 6). In FIGS. (10, 11), cut lines (L1) correspond to the designed sizes of piece section 12 and its bridges (121, 122).

The method for processing piece section 12 when forming grooves (130a, 130b) is not limited to router processing, and drilling and laser processing may also be employed. When forming tapered grooves, using a so-called V-groove processing tool is effective (see FIG. 28). Furthermore, chemical methods such as etching (dry or wet) may be used depending on the material of piece sections 12.

Figure 12:
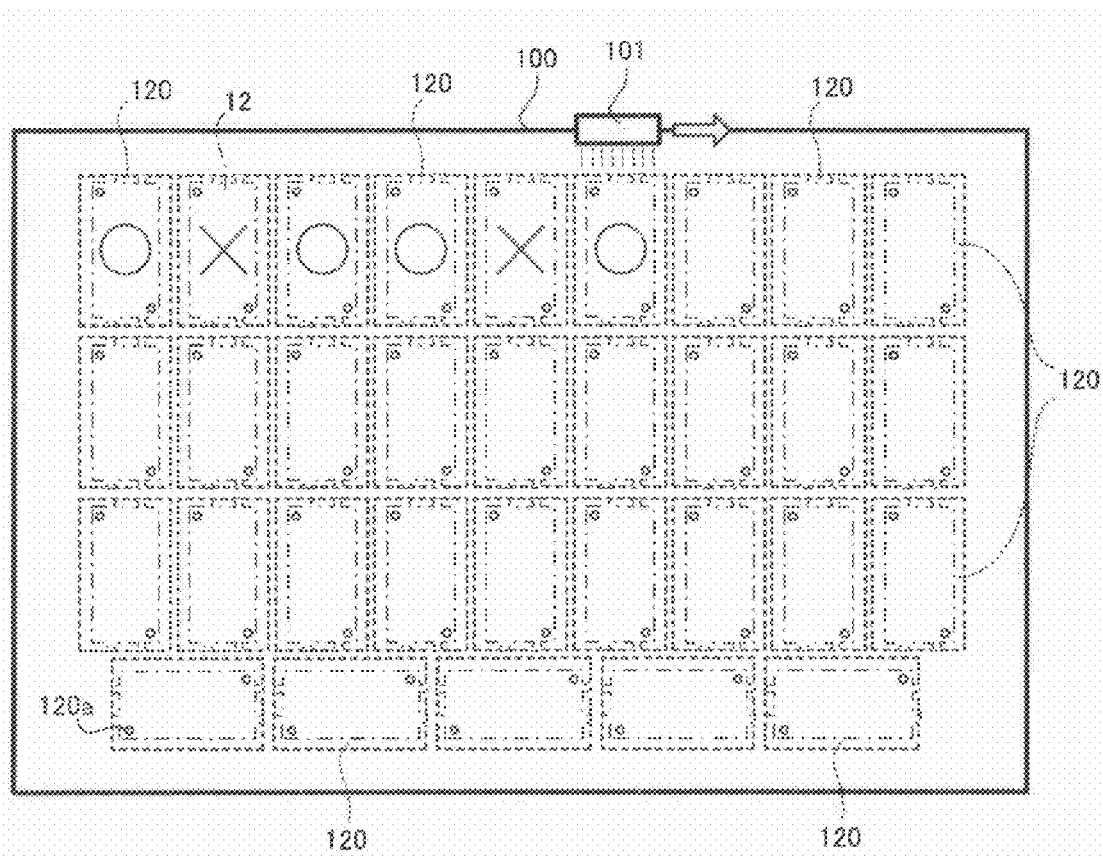
FIG. 12 is a view to illustrate a step for inspecting piece sections by a checker.
Figure 13A:
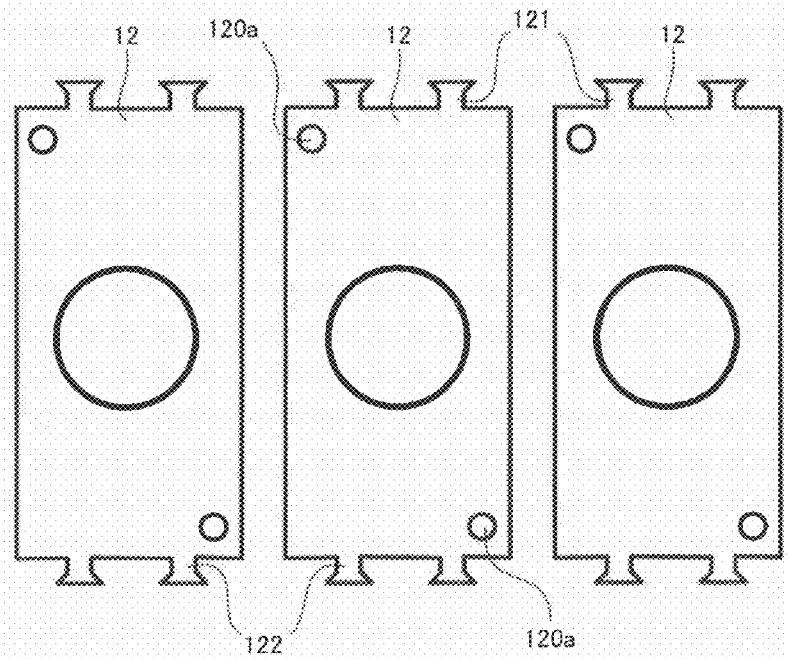
FIG. 13A is a view to illustrate a step for selecting good units and defective units from among the manufactured piece sections.
Figure 13B:
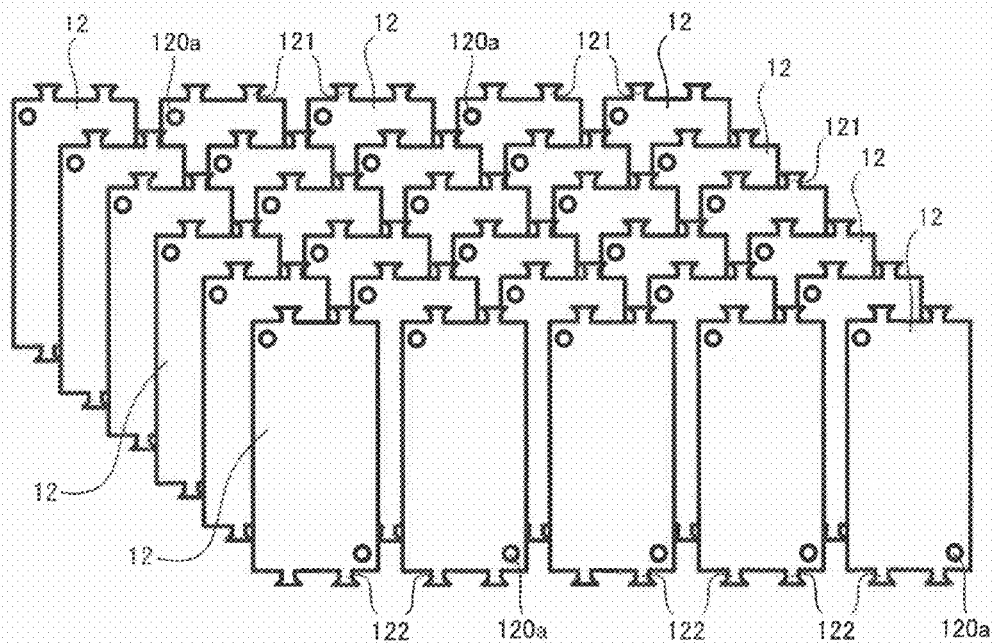
FIG. 13B is a view to illustrate a step for cutting out piece sections.

Then, in step (S13) of FIG. 7, predetermined inspections such as conductivity inspections are conducted on each piece section 12 using checker 101, for example, as shown in FIG. 12. For example, the quality of each unit of piece section 12, in a state formed in panel 100 as shown in FIG. 8, is inspected one by one. During such an inspection, piece sections are sorted into either good (piece section 12 with "○" in the drawing) or defective (piece section 12 with "x" in the drawing) piece sections. Piece sections 12 determined to be defective are removed by hand or by an automatic device, for example, during a step for cutting out the units one by one.

Next, in step (S14) of FIG. 7, using a router, for example, piece sections 12 and their bridges (121, 122) are cut along cut lines (L1) (FIGS. 10, 11). By removing defective units at this step, procedures separating a defective unit after it is joined may be reduced. Accordingly, as shown in FIGS. (13A, 13B), piece sections 12 and their bridges (121, 122) that are determined to be good and in the designed size are cut out. Piece sections 12 are each obtained as a unit piece section. Also, by severing each of grooves (130a, 130b), notch portions (134b, 133b) with width (D5) (FIGS. 3, 6) may be obtained.

Figure 14:
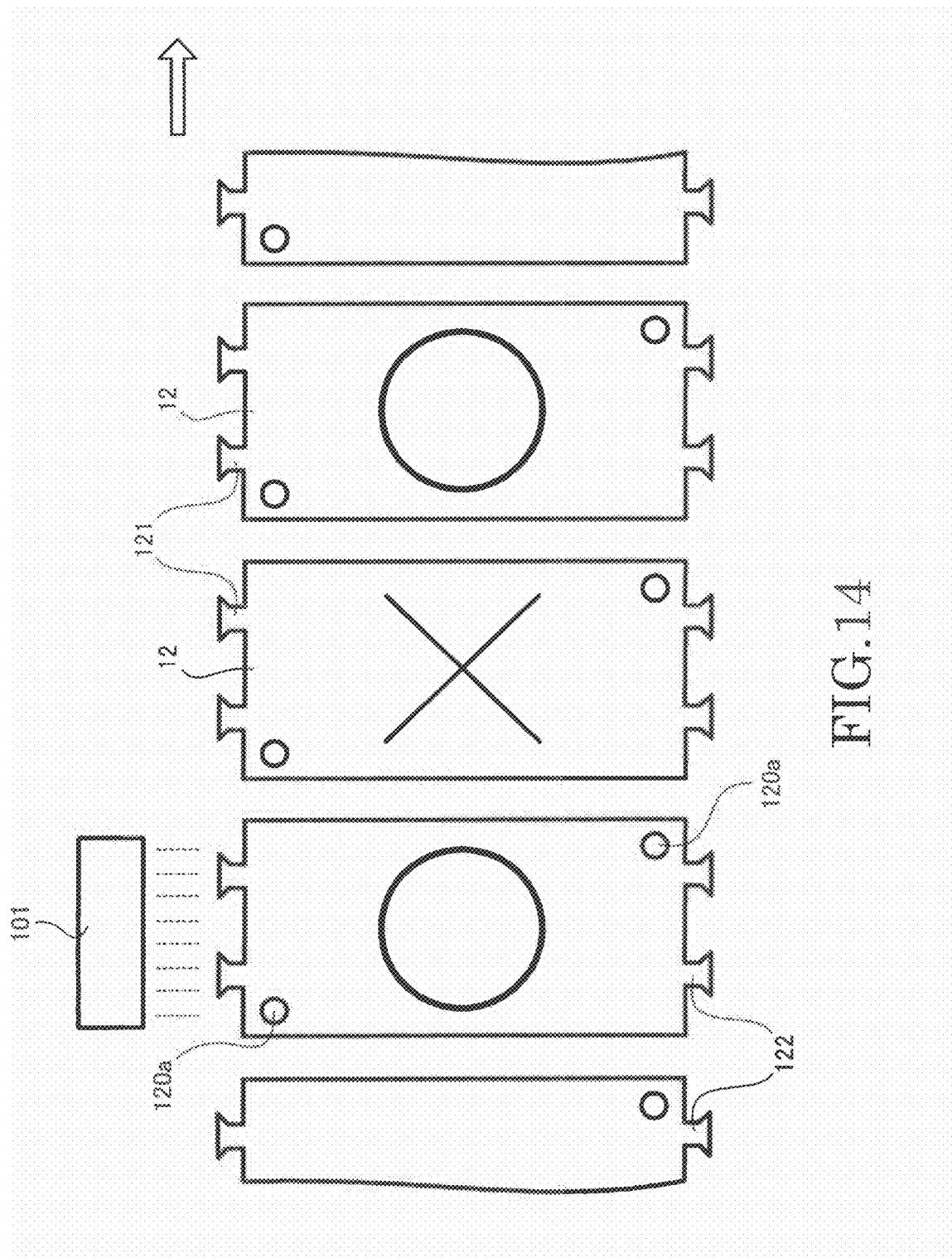
FIG. 14 is a view to illustrate another example of a step for inspecting piece sections.

Inspections such as conductivity inspection (step (S13)) may be conducted after piece sections 12 are cut out as shown in FIG. 14, for example.

Next, in step (S15) of FIG. 7, warping correction is conducted on each piece section 12. Here, such warping correction may be omitted unless necessary.

Through the steps described above, piece sections 12 and their bridges (121, 122) are completed. Such piece sections 12 and their bridges (121, 122) are used as piece sections (12a-12d) and their bridges (121a, 122a and others) as shown in FIG. 1 previously.

Figure 15:
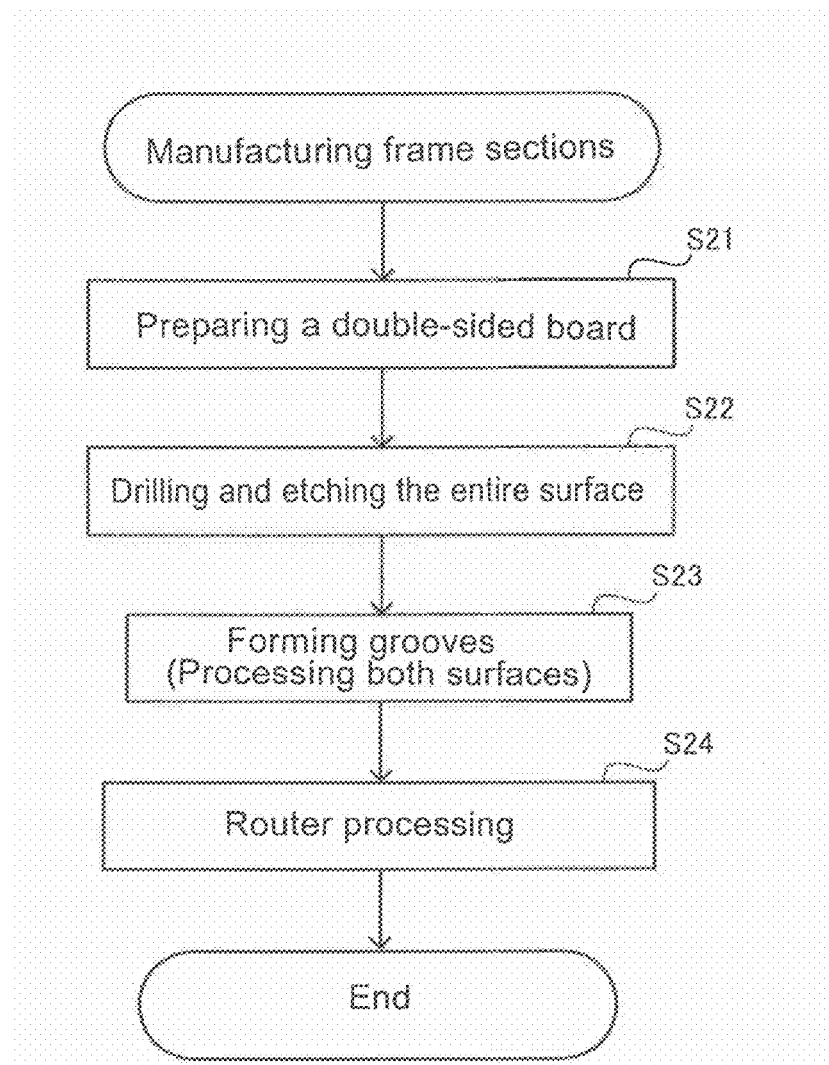
FIG. 15 is a flowchart showing a method for manufacturing a multi-piece board according to the present embodiment, especially showing the order of steps for manufacturing frame sections.

In the meantime, frame sections (11a, 11b) (FIG. 1) are manufactured through the steps as shown in FIG. 15, for example. In the present embodiment, since the structures (design data) are not different in frame sections (11a, 11b), common frame sections 11 are manufactured first and then used as frame sections (11a, 11b) in a later process.

Figure 16:
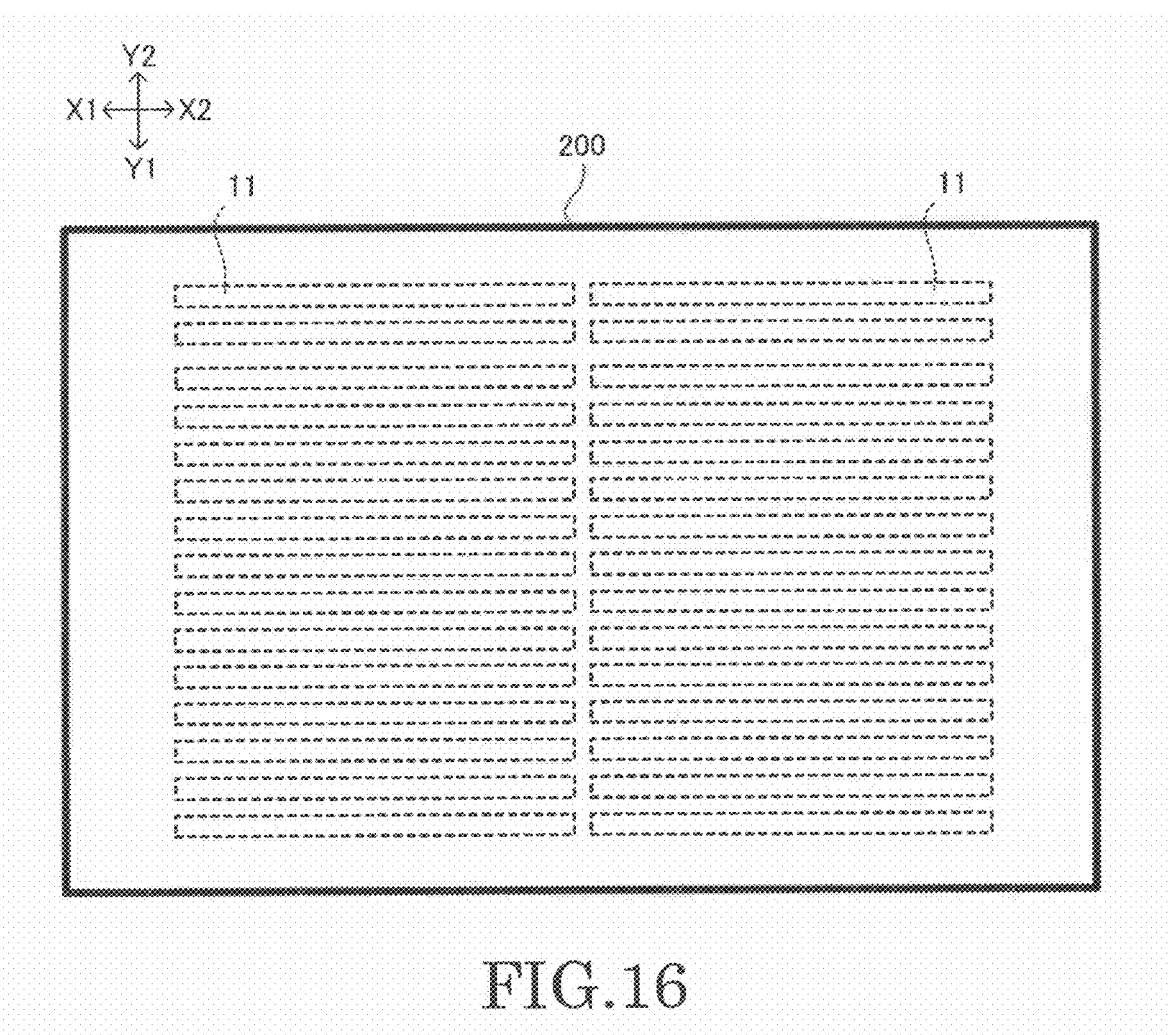
FIG. 16 is a view to illustrate a step for preparing a second panel.

In step (S21), panel 200 (second panel), different from panel 100 (FIG. 8), is prepared. As for panel 200, a double-sided copper-clad laminate (double-sided board) is prepared, for example. As shown in FIG. 16, a predetermined number of frame sections 11 are included in panel 200.

Panel 200 is not limited to a double-sided copper-clad laminate. For example, a wiring board, formed by alternately laminating a predetermined number of conductive layers and insulation layers on a double-sided copper-clad laminate (core substrate), may be used for panel 200. However, if a double-sided copper-clad laminate is used, panel 200 may be prepared at a lower cost. In addition, if a material (insulative substrate) without laminated copper foil is used, panel 200 may be prepared at an even lower cost (see FIG. 42 described later).

Figure 17:
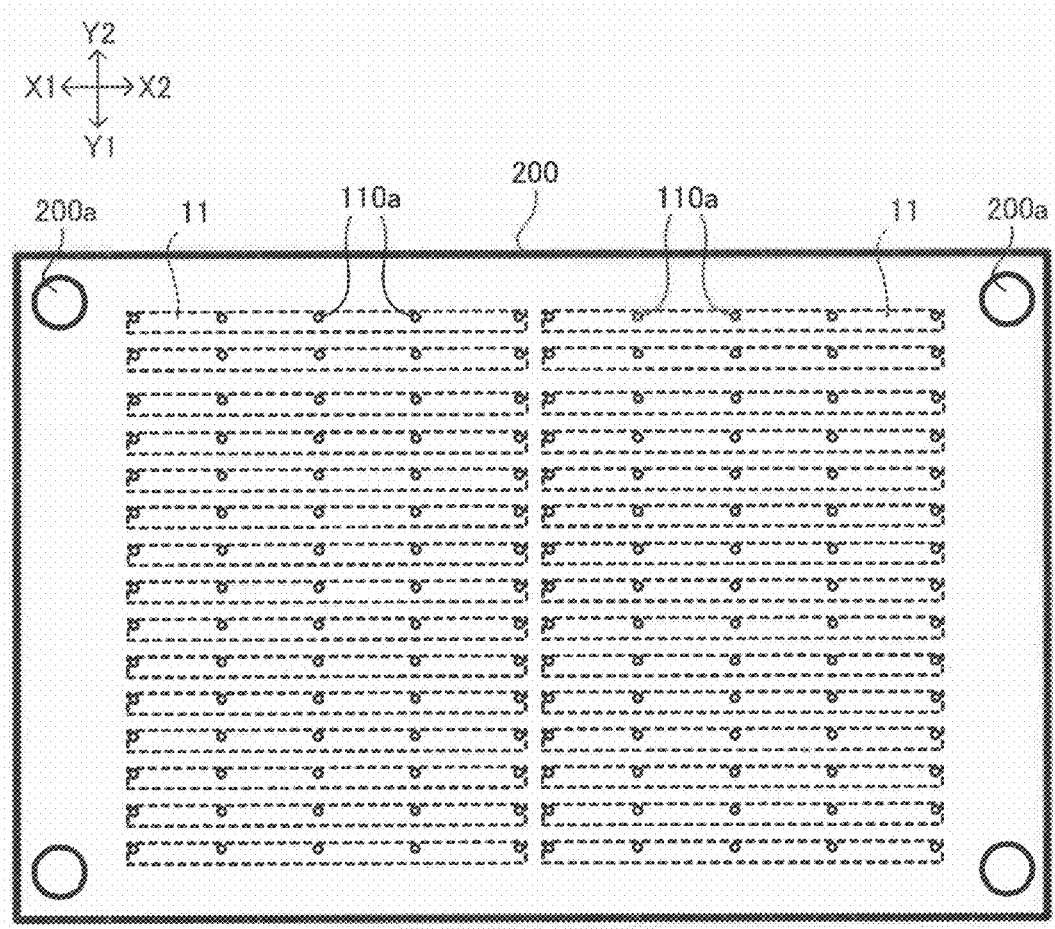
FIG. 17 is a view to illustrate a step for forming through holes for alignment in frame sections.

Next, in step (S22) of FIG. 15, through holes (base holes (200a) and holes (110a)) are formed using alignment drilling equipment, for example, as shown in FIG. 17. Base holes (200a) and holes (110a) are used for alignment or the like. Base holes (200a) are formed at four corners of panel 200, for example. However, the positions of base holes (200a) are not limited to such, and may be set diagonally on panel 200. Also, holes (110a) on frame sections 11 are formed in positions corresponding to spots between piece sections (12a-12d) (FIG. 1). However, the positions of holes (110a) are not limited to such, and may also be set only at both ends of frame sections 11.

After that, the entire surface of panel 200 is etched to remove copper foil. However, if the stability of copper foil is ensured by anti-corrosion treatment or protective solder resist or the like, the copper foil may remain to enhance strength.

Figure 18A:
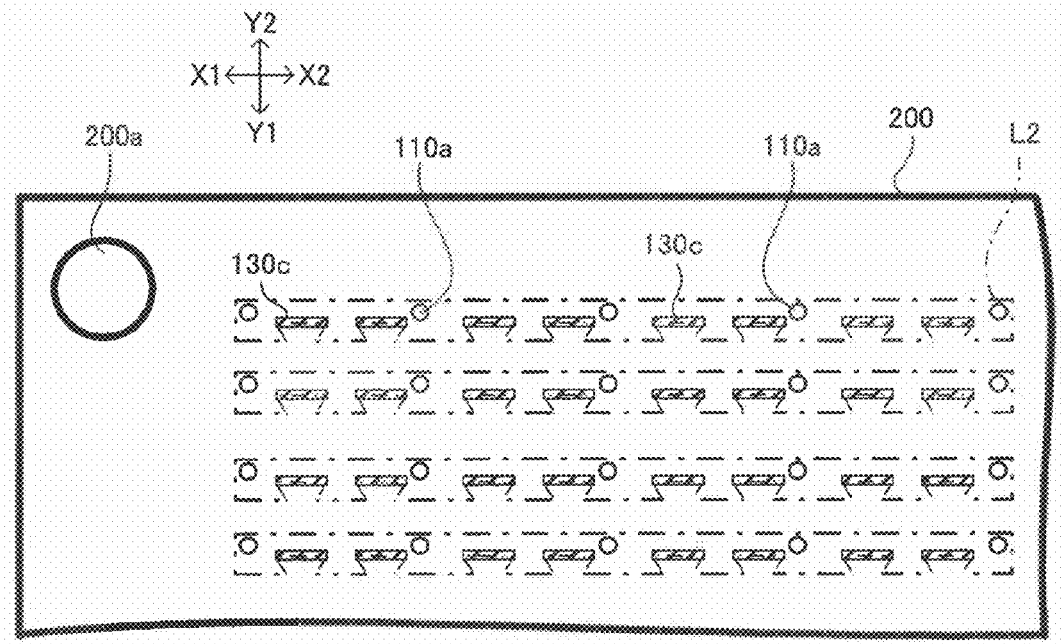
FIG. 18A is a partially magnified view of a second surface of the second panel.
Figure 18B:
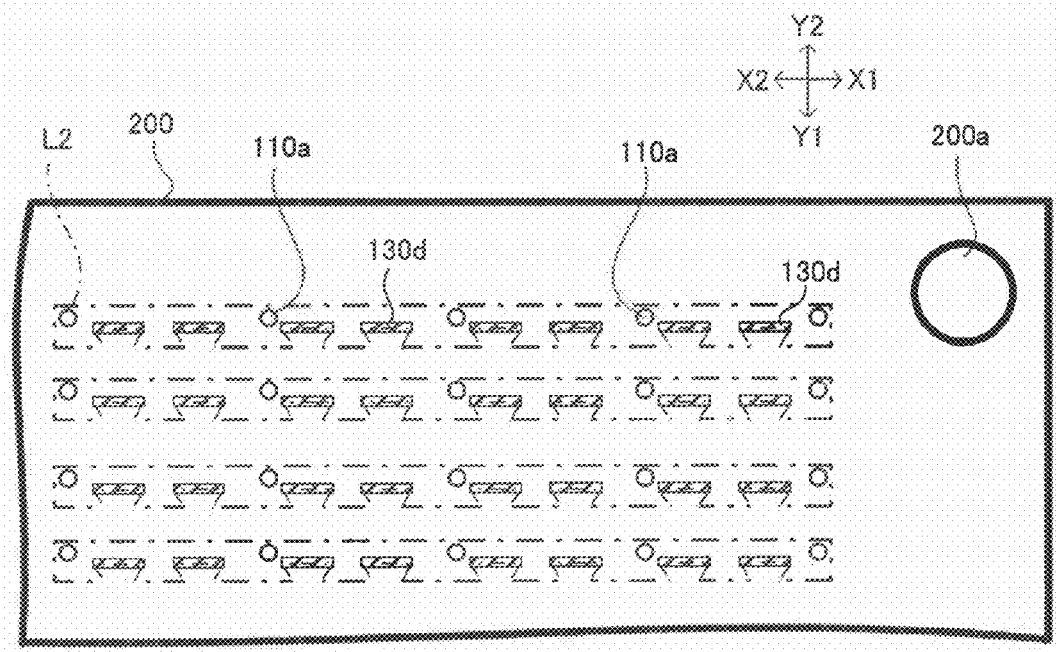
FIG. 18B is a partially magnified view of a first surface of the second panel.

Next, in step (S23) of FIG. 15, using a router, for example, the panel is dug to a predetermined depth without penetrating through the panel. Accordingly, as shown in FIG. 18A, grooves (130c) are formed in predetermined spots on the second surface of frame sections 11; and as shown in FIG. 18B, grooves (130d) are formed in predetermined spots on the first surface of frame sections 11. Grooves (130c) are formed to correspond to notch portions (131a, 132a) (FIGS. 6, 3); and grooves (130d) are formed to correspond to notch portions (133a, 134a) (FIGS. 6, 3). The width of grooves (130c) is set greater than (D3) (FIG. 3). Also, the width of grooves (130d) is set greater than (D4) (FIG. 3). In FIGS. (18A, 18B), cut lines (L2) correspond to the designed size of frame sections 11.

The method for processing frame section 11 when forming grooves (130c, 130d) is not limited to router processing, and drilling and laser processing may also be employed. When forming tapered grooves, using a so-called V-groove processing tool is effective (see FIG. 28). Furthermore, chemical methods such as etching (dry or wet) may be used depending on the material of frame sections 11.

Then, in step (S24) of FIG. 15, frame sections 11 are severed by a router along cut lines (L2) (FIGS. 18A, 18B). By doing so, frame sections 11 in the designed size are produced. Also, by cutting each of grooves (130c, 130d), notch portions (131a, 132a) (FIGS. 6, 3) having width (D3) may be obtained.

Through the procedures so far, frame sections 11 are completed. Frame sections 11 are used as frame sections (11a) or (11b) as shown in FIG. 1 previously.

Figure 19:
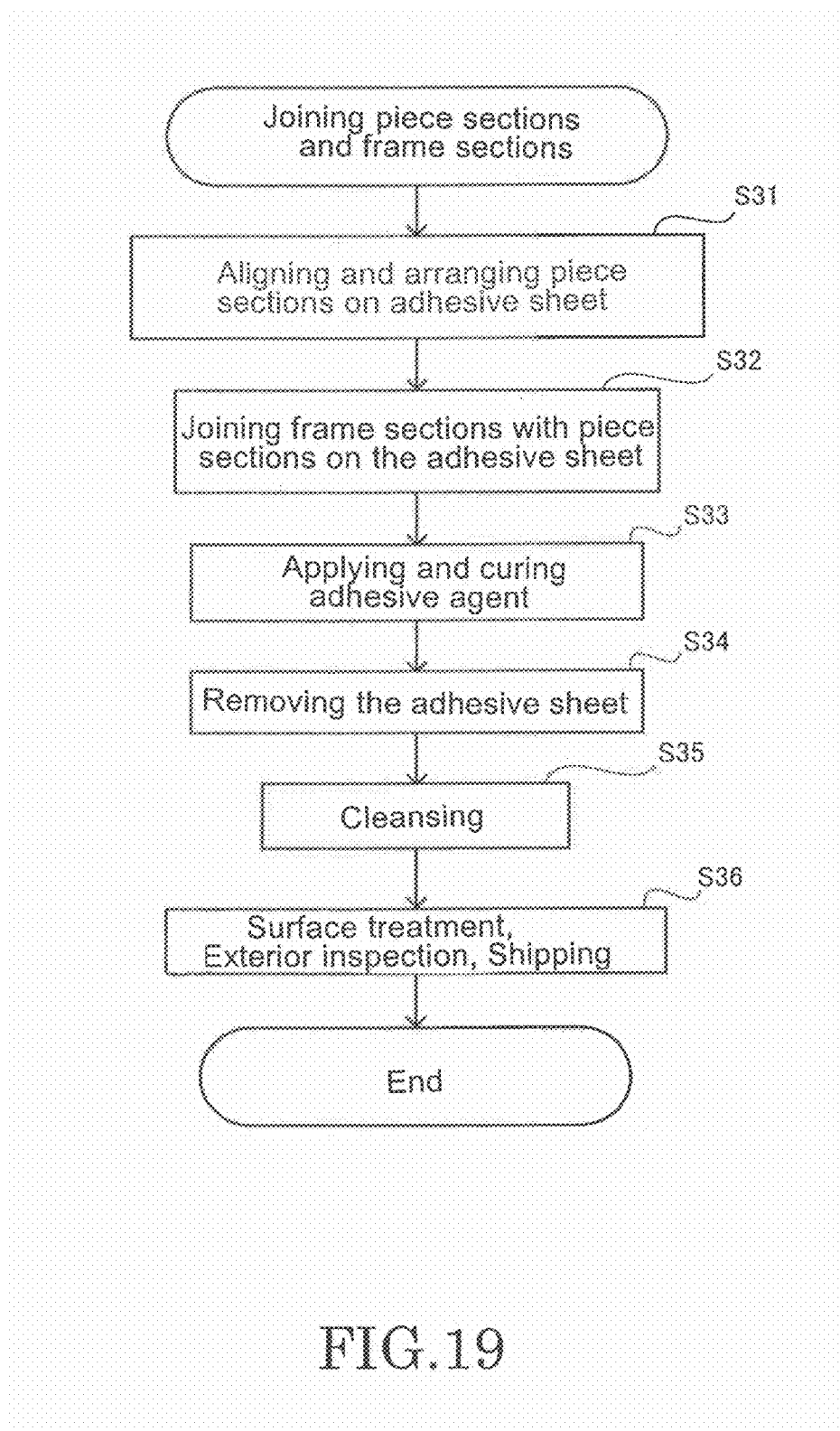
FIG. 19 is a flowchart showing a method for manufacturing a multi-piece board according to the present embodiment, especially showing the order of steps for joining piece sections and frame sections.

Piece sections (12a-12d) (FIG. 1) and frame sections (11a, 11b) (FIG. 1) are joined by the steps shown in FIG. 19, for example.

Figure 20:
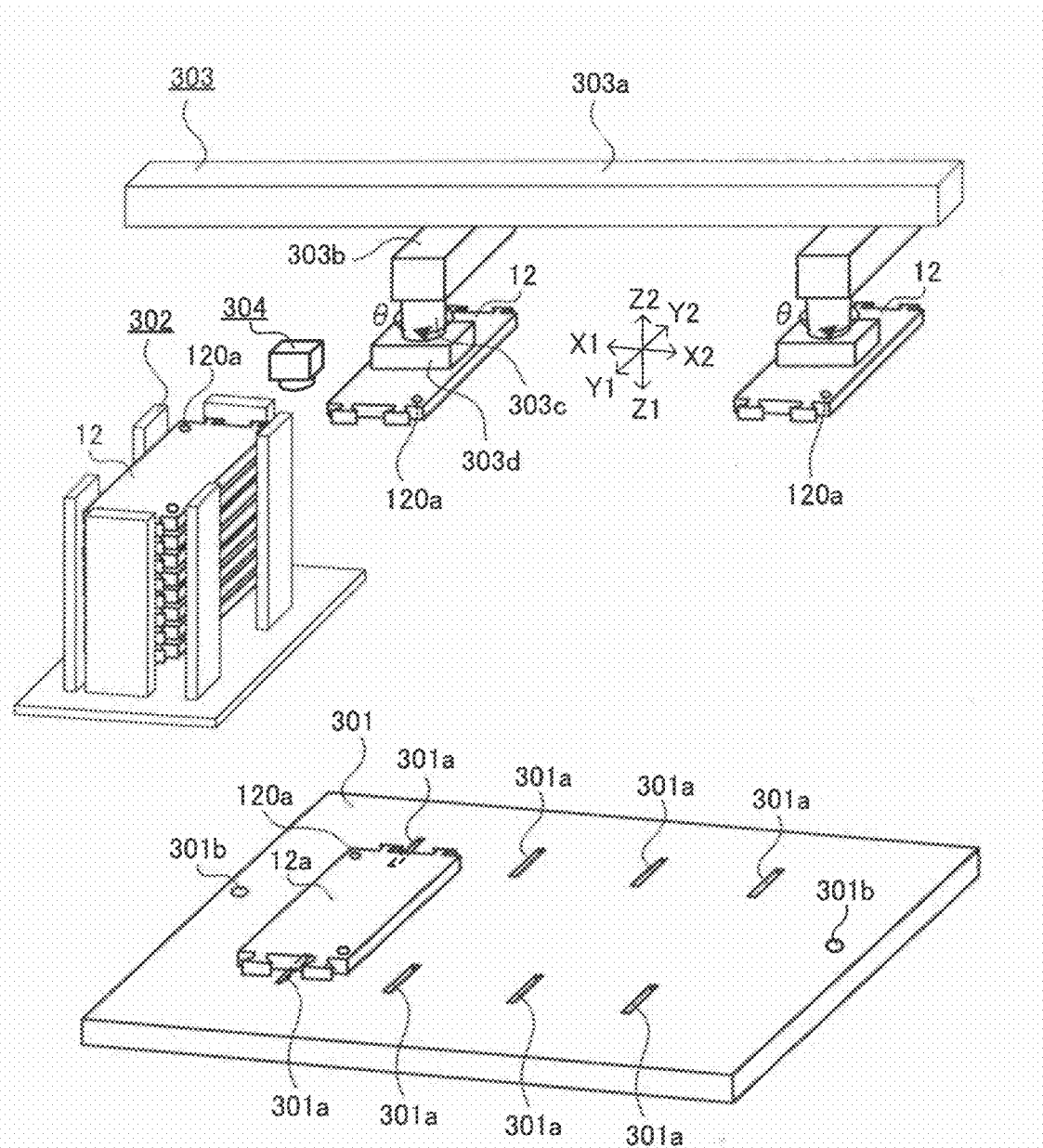
FIG. 20 is a view to illustrate a step for positioning piece sections on predetermined spots of an adhesive sheet.

After the procedures shown in FIG. 7, piece sections 12 are stored in stocker 302 as shown in FIG. 20. In stocker 302, piece sections 12 are stored by stacking them. Then, in step (S31), a piece section 12 in stocker 302 is lifted up using mounter 303 and arranged on a predetermined spot of adhesive sheet 301 (a board material having adhesiveness on its entire surface) after the positions of alignment patterns (120a) (alignment marks) of the piece section 12 are confirmed by using camera 304.

Here, mounter 303 has bar-type frame (303a) elongated in directions X, expandable arm (303b) which expands/shrinks in directions Y, shaft (303c) which expands/shrinks in directions Z and rotates in direction θ, and suction pad (303d) which allows attachment/detachment of piece section 12. Expandable arm (303b) is connected to bar-type frame (303a)

and moves horizontally along bar-type frame (303a) in directions X. Shaft (303c) is connected to expandable arm (303b) and has suction pad (303d) at one end. Therefore, as expandable arm (303b) moves horizontally and expands/shrinks while shaft (303c) expands/shrinks and rotates, the XYZ coordinates of suction pad (303d) and even its angles may be adjusted freely. Suction pad (303d) suction-grips piece section 12 using a vacuum chuck, for example.

Although not shown in the drawing, camera 304 also has a movable structure substantially the same as that of mounter 303 and moves horizontally in directions (X, Y).

When positioning piece section 12 on adhesive sheet 301, first, suction pad (303d) suction-grips piece section 12. Then, mounter 303 lifts piece section 12 in direction Z2 and brings piece section 12 to a spot where camera 304 can recognize alignment patterns (120a) of piece section 12. Camera 304 shifts its position in directions X or directions Y according to requirements so that it can read the positioning data of alignment patterns (120a). Such positioning data are transmitted to a computer which prepares an order to mounter 303 according to the positioning data. Then, mounter 303 receives the order and arranges piece section 12 on a predetermined spot of adhesive sheet 301. Accordingly, piece sections (12a-12d) are arranged one by one on adhesive sheet 301 to be positioned as shown in FIG. 1.

Adhesive sheet 301 is adhesive. Thus, piece sections (12a-12d) placed on adhesive sheet 301 are preliminarily secured by such adhesiveness. Also, in adhesive sheet 301, two through holes (301a) are formed in an area corresponding to each of piece sections (12a-12d). Through holes (301a) are long holes elongated in directions Y. Piece sections (12a-12d) are each arranged on two through holes (301a). In doing so, substantially half (half a hole in the longitudinal direction) of each through hole (301a) is covered by piece sections (12a-12d). In addition, adhesive sheet 301 has base holes (301b).

Figure 21:
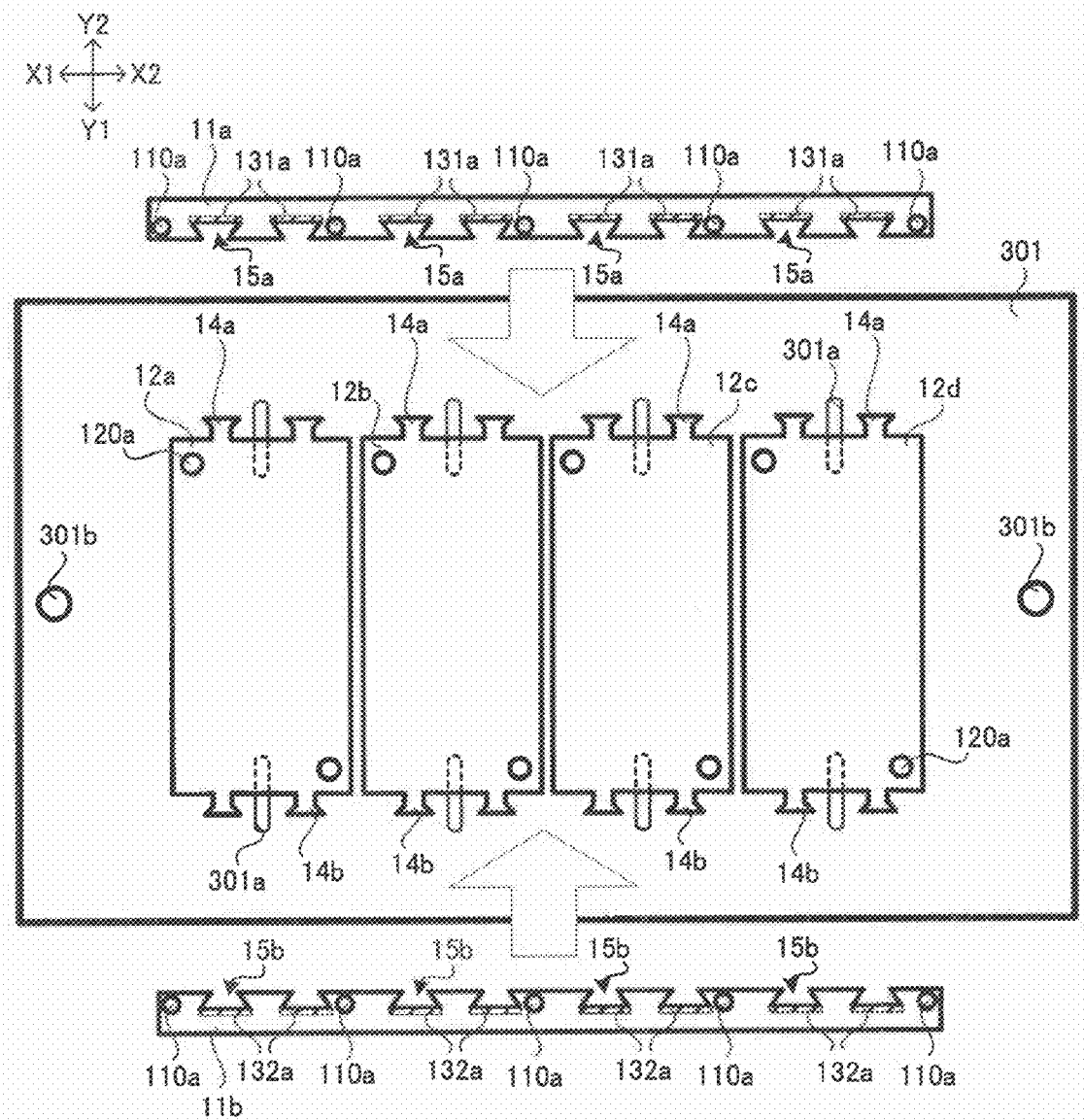
FIG. 21 is a view to illustrate a step for positioning piece sections and frame sections opposite each other by sandwiching notch portions.
Figure 22:
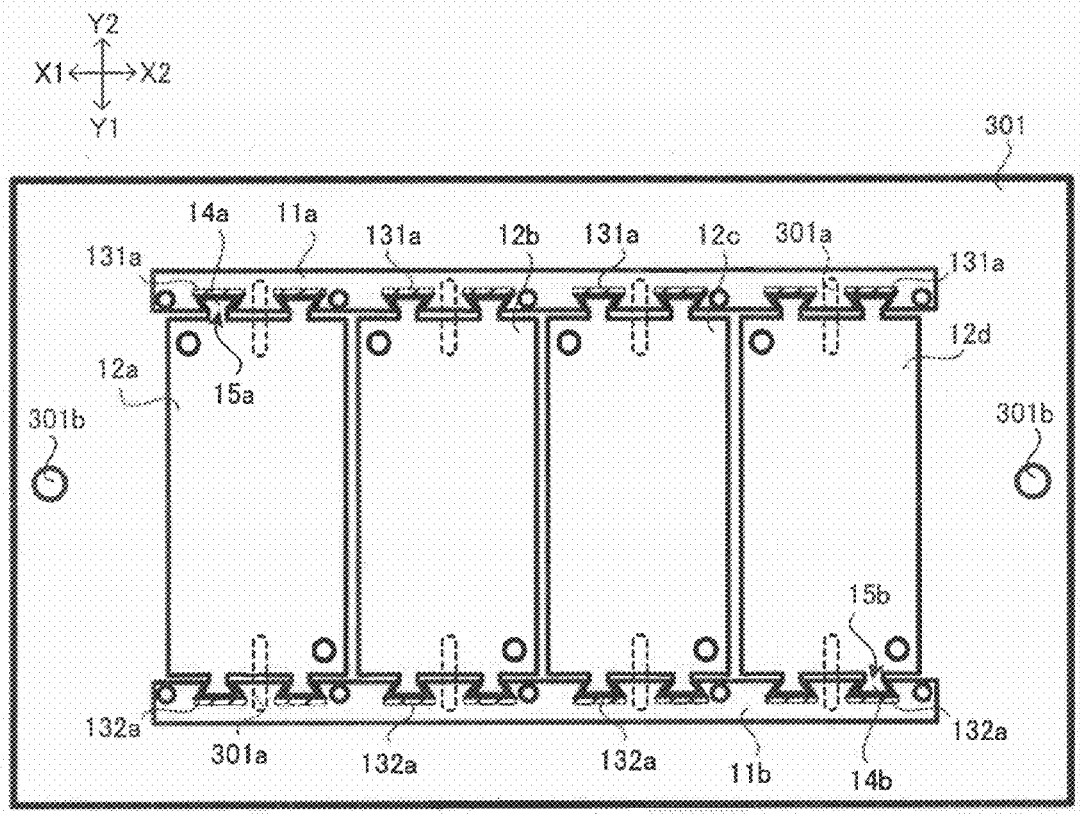
FIG. 22 is a view showing piece sections and frame sections positioned opposite each other by sandwiching notch portions.

Next, in step (S32) of FIG. 19, frame sections (11a, 11b) are joined with piece sections (12a-12d) by hand, as shown in FIG. 21. Accordingly, as shown in FIG. 22, each through hole (301a) is set under one of piece sections (12a-12d) and frame section (11a) or (11b) to be completely covered. Also, joint portion (15b) of frame section (11b) and joint portion (14b) of piece section (12a) are arranged with predetermined clearances (D1, D2) (see FIGS. 2A, 2B), as shown in FIGS. 2A, 2B and 3). Cavities (131, 132) (FIGS. 6, 4) are formed between frame section (11b) and piece section (12a) so that adhesive agent 16 may be injected. In addition, warping correction is conducted according to requirements. The configuration of cavities (131, 132) and the values of clearances (D1, D2) are as described previously.

Figure 23:
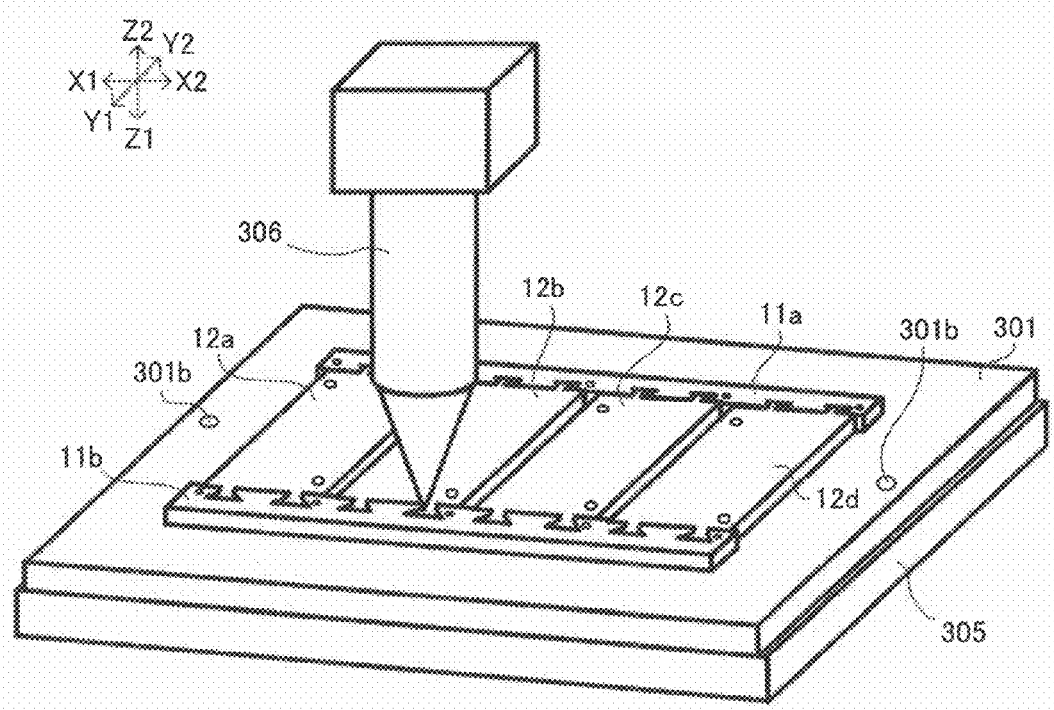
FIG. 23 is a view to illustrate a step for applying an adhesive agent in clearances between piece sections and frame sections.
Figure 24:
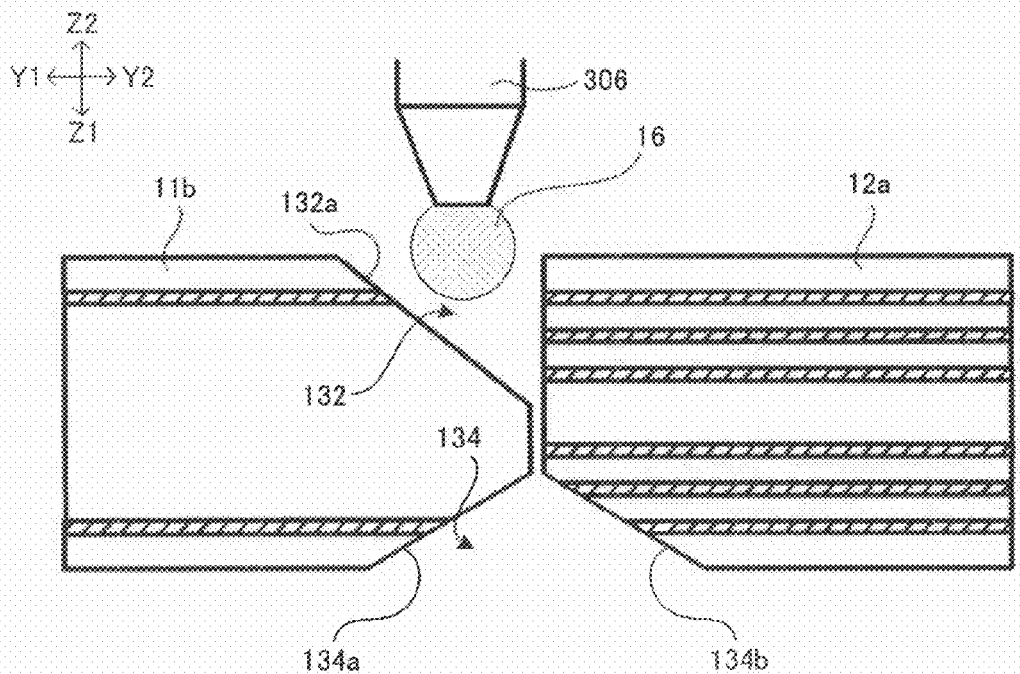
FIG. 24 is a cross-sectional view showing part of FIG. 23.

Next, in step (S33) of FIG. 19, adhesive sheet 301 is set on stand 305, as shown in FIG. 23 and FIG. 24 (partial cross-sectional view of FIG. 23), and adhesive agent 16 made of UV-curable resin, for example, is applied to clearances (D1, D2) between piece sections (12a-12d) and frame sections (11a, 11b) using dispenser 306. Pins (omitted from the drawings) of stand 305 are inserted into base holes (301b) of adhesive sheet 301 for alignment.

Here, although omitted from the drawings, dispenser 306 has substantially the same movable structure as that of mounter 303, and is movable horizontally along directions X and Y, as well as vertically along directions Z. Therefore, using dispenser 306, adhesive agent 16 may be applied at any spot on adhesive sheet 301. During that time, it is preferred to align the end surface of adhesive sheet 301 by aligning the dispenser based on alignment patterns (120a), for example. In the present embodiment, adhesive agent 16 is injected into cavities (131, 132) (FIGS. 6, 4) by dispenser 306.

By injecting adhesive agent 16 into cavities (131, 132), as shown previously in FIGS. 2A, 2B), adhesive agent 16 flows into other clearances and fills each clearance. During that time, since notch portion (133a) is formed on the first-surface side of an end portion of frame section (11a), notch portion (134a) is formed on the first-surface side of an end portion of frame section (11b), and notch portions (133b, 134b) are further formed on the first-surface side of both end portions of piece section (12a), adhesive agent 16 is suppressed from seeping out, as described previously.

After that, adhesive agent 16 is cured by spot-beaming UV rays, for example. By filling and curing adhesive agent 16 between piece sections (12a-12d) and frame sections (11a, 11b), piece sections (12a-12d) and frame sections (11a, 11b) are joined and secured (adhered). Accordingly, piece sections (12a-12d) and frame sections (11a, 11b) are integrated, and multi-piece board 10 is completed as shown in FIG. 1 previously.

A UV-curable adhesive agent used in the present invention is a non-thermosetting adhesive agent and does not require a thermal treatment to be cured. Thus, by using a UV-curable adhesive agent, the shape of a board may be suppressed from transformation caused by temperature change (such as shrinkage after being cured). Photocurable adhesive agents are usually non-thermosetting adhesives. Thus, photocurable adhesive agents other than UV-curable adhesive agents may also be used as adhesive agent 16. In addition, acrylic adhesives curable by energy irradiation or two-pack type acrylic adhesives may also be effective. Since acrylic adhesive agents are also non-thermosetting adhesives and do not require thermal treatments, by using acrylic adhesive agents, the shape of a substrate may be suppressed from being transformed (such as shrinking after being cured). Photocurable adhesive agents indicate adhesives curable by irradiation of predetermined electromagnetic waves (including UV or the like) which are not limited to visible light.

Adhesive agents other than photocurable adhesive agents or acrylic adhesive agents may also be used. For example, thermosetting adhesive agents may be used. When using thermosetting adhesive agents, there is an advantage of higher adhesive strength.

Two or more kinds of adhesive agents may also be used. For example, after adhering with a non-thermosetting adhesive agent such as a photocurable adhesive agent or an acrylic adhesive agent, a thermosetting adhesive agent may be used for reinforcement.

Figure 25:
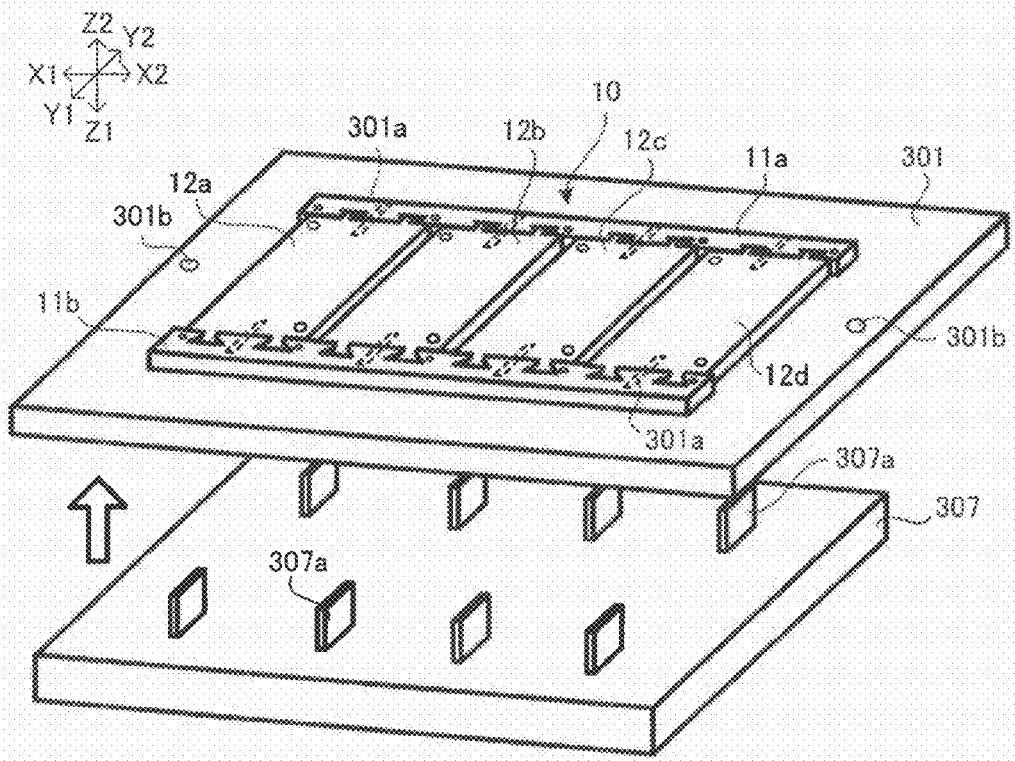
FIG. 25 is a view to illustrate a step for removing the adhesive sheet from the multi-piece board.

Next, in step (S34) of FIG. 19, adhesive sheet 301 is removed from multi-piece board 10 using device 307, for example, as shown in FIG. 25.

Figure 26:
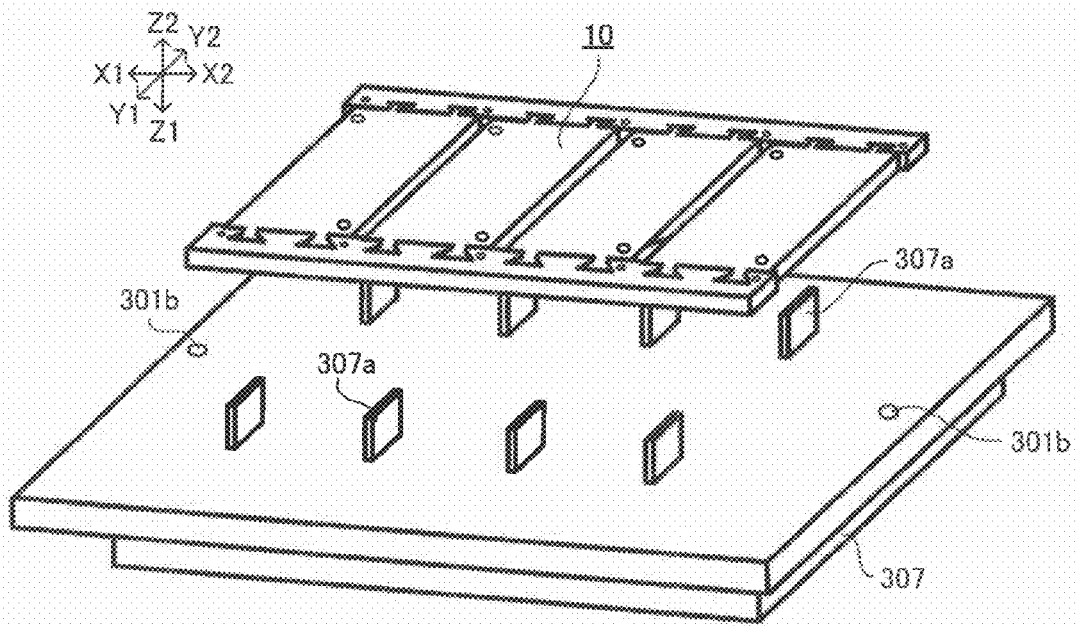
FIG. 26 is a view showing a state in which the multi-piece board and the adhesive sheet are separated.

Here, device 307 has protruding portions (307a) (protruding posts) which protrude in directions Z (specifically, toward the arrow-Z2 side in the drawing). The number and the planar shape of protruding portions (307a) correspond to the number and the planar shape of through holes (301a). Namely, protruding portions (307a) are elongated in directions Y, the same as through holes (301a). However, being made one size smaller than through hole (301a), each protruding portion (307a) may be inserted into through hole (301a). By inserting protruding portions (307a) into through holes (301a), the lower surface (the first surface) of multi-piece board 10 is pressed against the tips (especially the top surfaces) of protruding portions (307a). In doing so, as shown in FIG. 26, multi-piece board 10 on adhesive sheet 301 is pushed out, and multi-piece board 10 and adhesive sheet 301 will be separated. Adhesive sheet 301 may be reusable about 1,000 times, for example.

Next, in step (S35) of FIG. 19, multi-piece board 10 is cleansed.

After that, in step (S36) of FIG. 19, surface treatments and exterior inspections are conducted, and multi-piece boards 10 are shipped as finished products.

According to the above procedures, only good pieces are selected to manufacture multi-piece board 10. If a defective piece is found, the multi-piece board may be restored by separating only the defective piece by shining, for example, and replacing it with a good piece. By such a restoration procedure, when part of multi-piece board 10 becomes defective, it is not necessary to discard the entire board and thus other good pieces will not be wasted. Therefore, productivity and unit yields may be enhanced.

The manufacturing method of the present embodiment is effective in enhancing yield rates and productivity in mounting procedures of electronic components. For example, since adhesive sheet 301 is used for a preliminary fixing, tapes or the like for a preliminary fixing are not required. Thus, a step to secure a tape is not required, either. As a result, manufacturing costs may be reduced. Also, since piece section units (piece sections 12) determined in advance to be good are adhered to frame sections (11a, 11b), the number of piece sections to be joined (in the present embodiment is four: piece sections (12a-12d)) may be determined freely. As a result, the number of piece-section units in a multi-piece board, which has been limited to 3-4 pieces per frame due to restrictions when combining pieces on manufacturing panels, may be increased. Accordingly, productivity in mounting procedures of electronic components will improve.

In the manufacturing method of the present embodiment, adhesive agent 16 is injected into cavities (131, 132). In doing so, adhesive agent 16 is securely filled in clearances between piece sections (12a-12d) and frame sections (11a, 11b). Thus, remarkable connection strength may be achieved between piece sections (12a-12d) and frame sections (11a, 11b). Thus, piece sections (12a-12d) may be suppressed from falling or the like, resulting in easier handling. As a result, productivity will be enhanced.

In the manufacturing method of the present embodiment, piece sections (12a-12d) are aligned by having camera 304 recognize the alignment marks of piece sections (12a-12d). Thus, without using a device with pins, piece sections (12a-12d) may be positioned with a high degree of accuracy.

In the manufacturing method of the present embodiment, piece sections (12a-12d) and frame sections (11a, 11b) are adhered by adhesive agent 16. Thus, connection strength is great between frame sections (11a, 11b) and good pieces. Also, since frame sections (11a, 11b) and good pieces are firmly secured after alignment, their positional accuracy after being adhered is high.

So far, a multi-piece board and its manufacturing method according to the embodiment of the present invention have been described. However, the present invention is not limited to the above embodiment.

Figure 27:
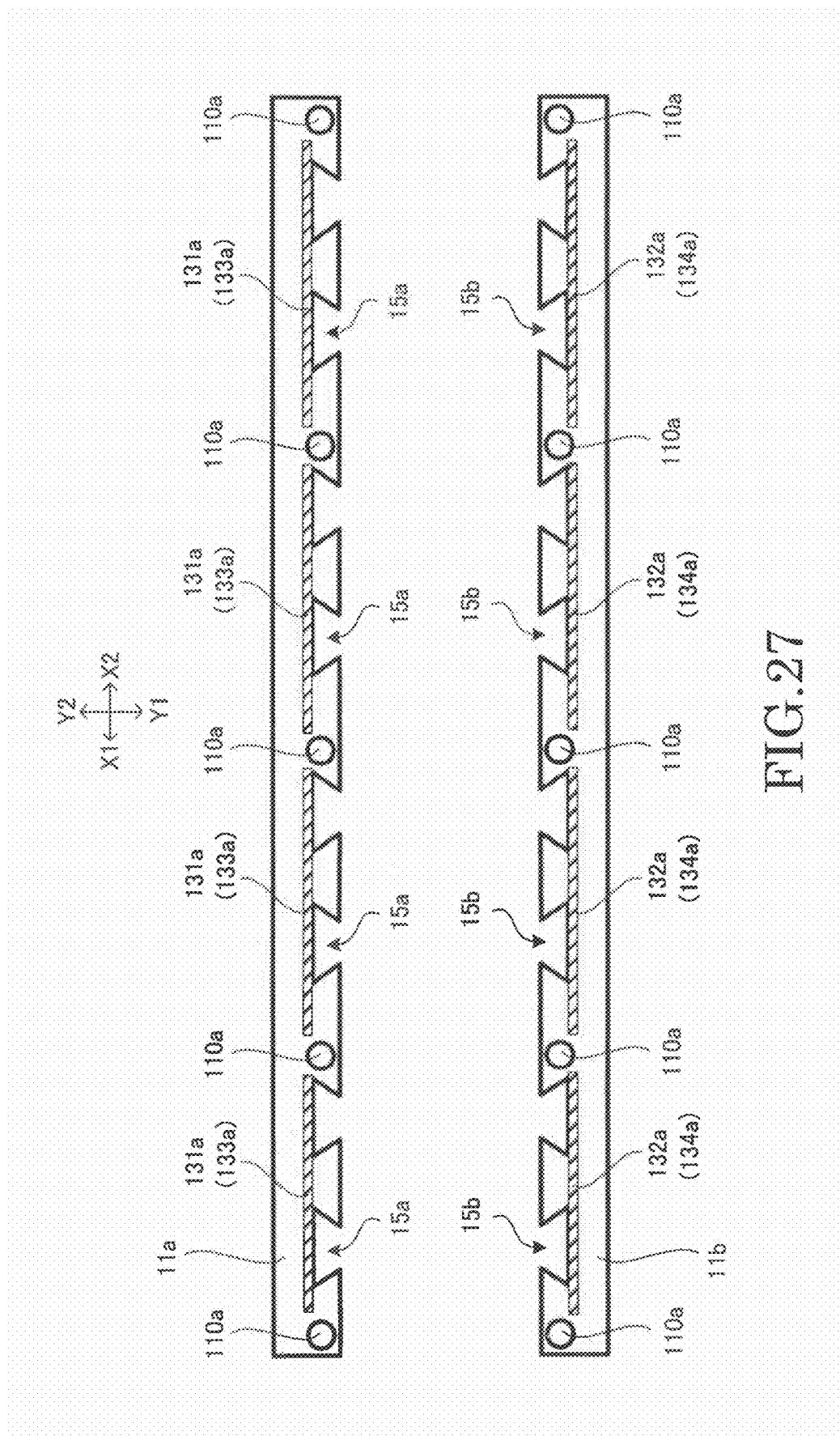
FIG. 27 is a view of a first alternative example showing a planar structure of notch portions of frame sections.
Figure 28:
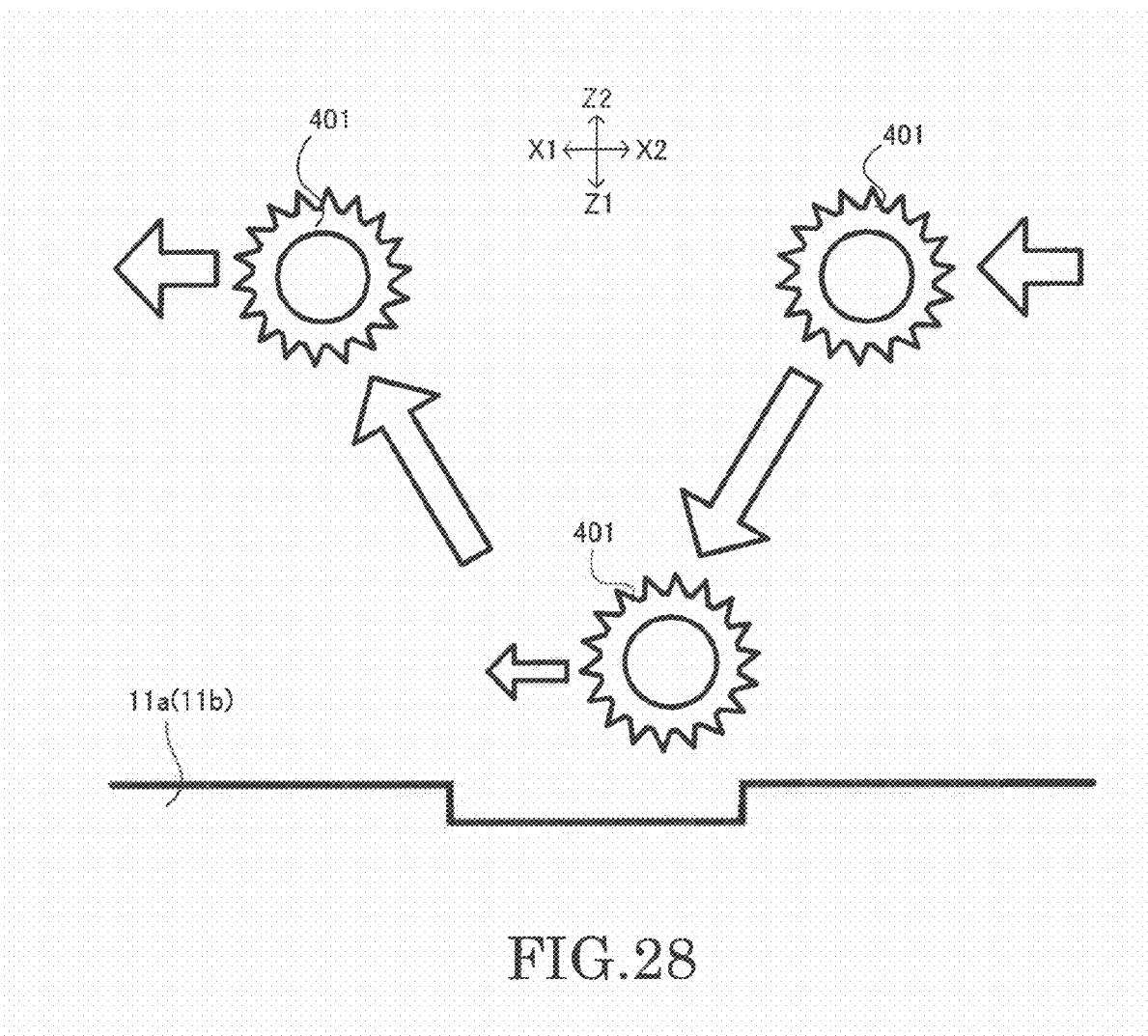
FIG. 28 is a view to illustrate an example of a method for forming notch portions shown in FIG. 27.

The positioning of notch portions (131a, 132a, 133a, 134a) is not limited to the positions in the above embodiment. For example, as shown in FIG. 27, while excluding areas where holes (110a) are positioned, notch portions (131a, 132a, 133a, 134a) may be formed from one end to the other end of frame section (11a) or (11b). In such a case, as shown in FIG. 28, for example, frame section (11a) or (11b) is preferred to be processed intermittently from one end to the other end by moving V-groove processing tool 401 from one end of frame section (11a) or (11b) toward the other end while jumping V-groove processing tool 401 to skip the portions where holes (110a) are positioned.

Figure 29:
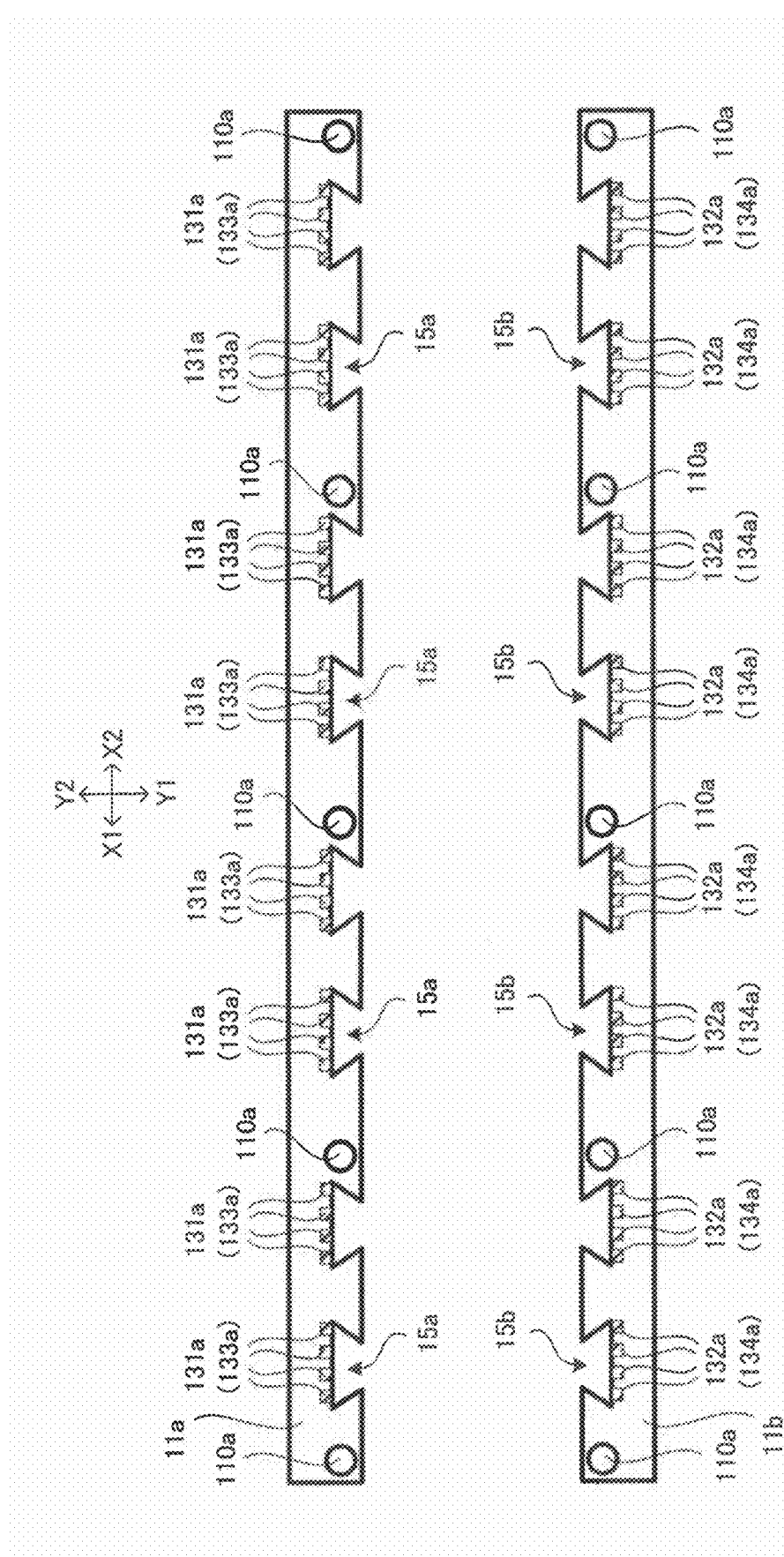
FIG. 29 is a view of a second alternative example showing a planar structure of notch portions on the frame-section side.
Figure 30:
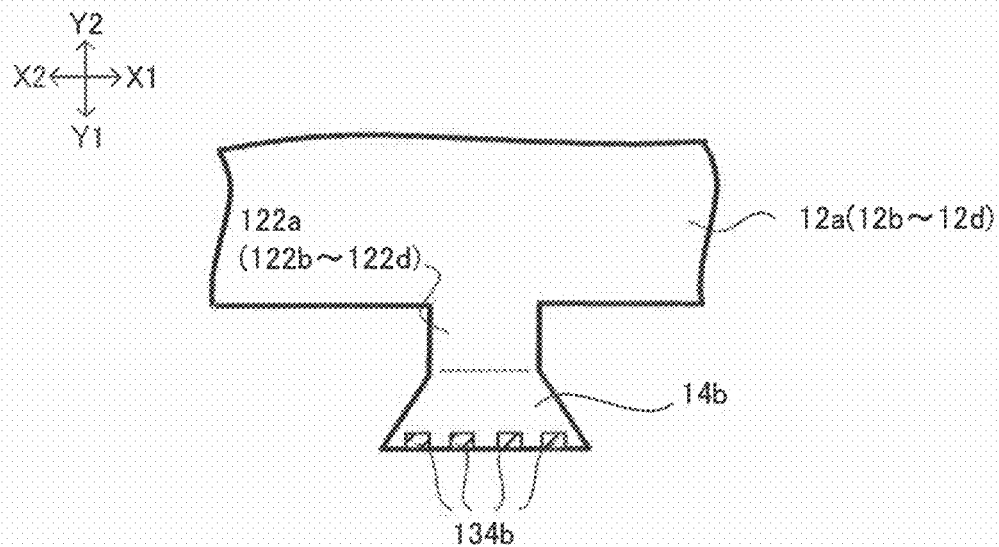
FIG. 30 is a view of an alternative example showing a planar structure of a notch portion on the piece-section side at a first joint portion.
Figure 31:
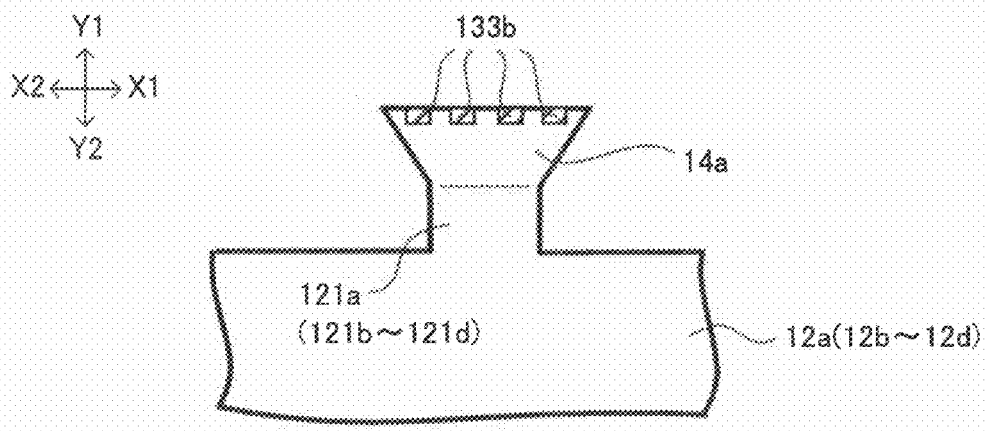
FIG. 31 is a view of an alternative example showing a planar structure of a notch portion on the piece-section side at a second joint portion.

As shown in FIG. 29, notch portions (131a, 132a, 133a, 134a) may be formed by splitting them into multiple small portions. Also, notch portions (134b, 133b) may also be formed by splitting them into multiple small portions, as shown in FIGS. (30, 31). Such notch portions (131a, 132a, 133a, 134a) are preferred to be formed by a router bit, drill or laser, for example. In such a case, cavities (131-134) are not grooves, but are a series of multiple small holes.

Figure 32A:
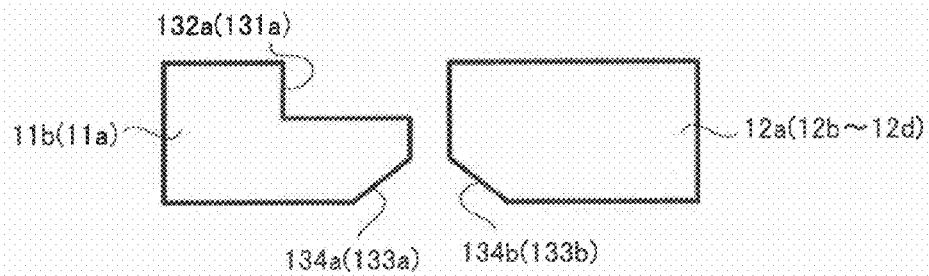
FIG. 32A-FIG. 32D are views showing alternative examples of the shape of a notch portion on the second-surface side when formed in a frame section.
Figure 32B:
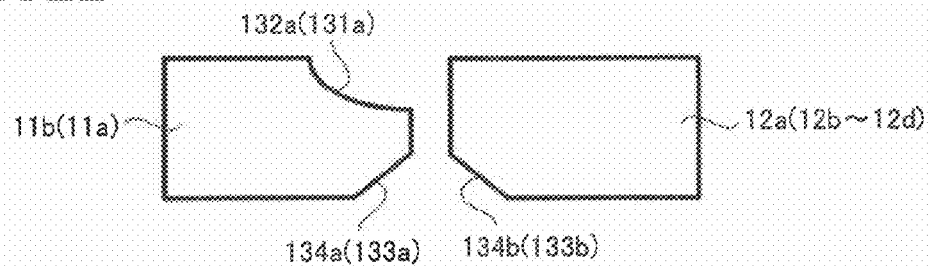
Figure 32C:
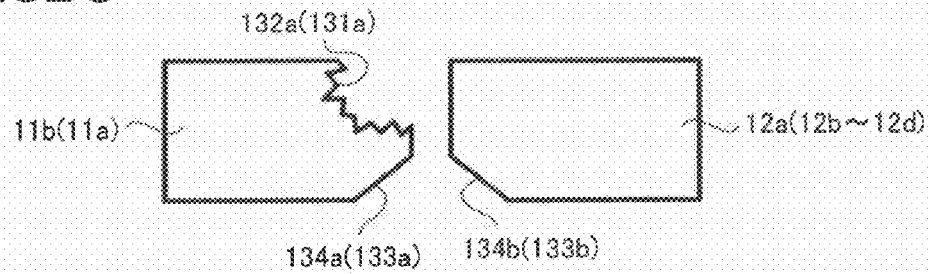
Figure 32D:
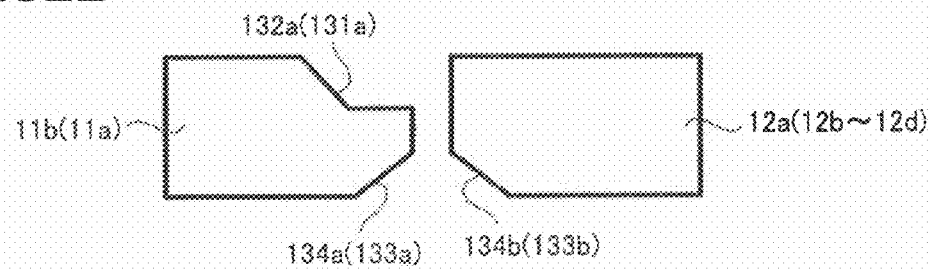
Figure 33A:
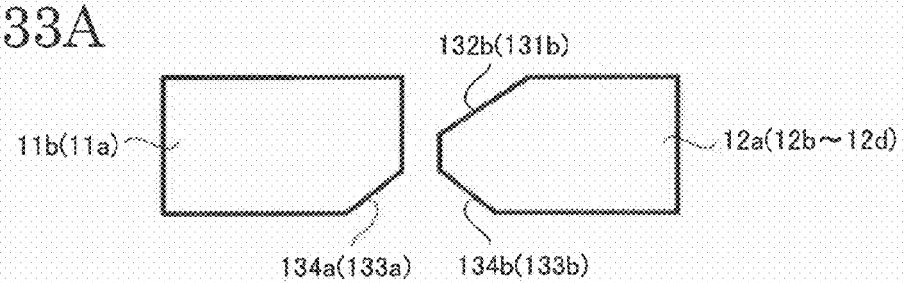
FIG. 33A-FIG. 33E are views showing alternative examples of the shape of a notch portion on the second-surface side when formed in a piece section.
Figure 33B:
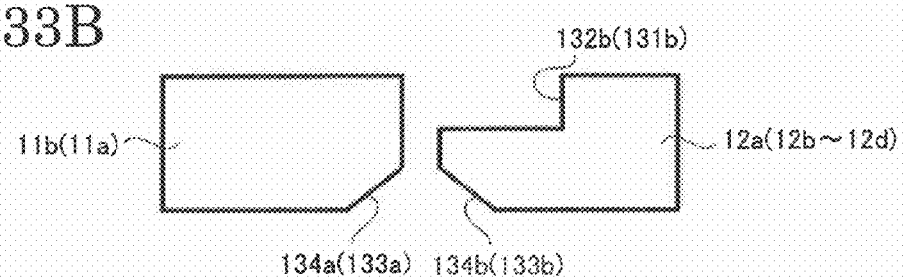
Figure 33C:
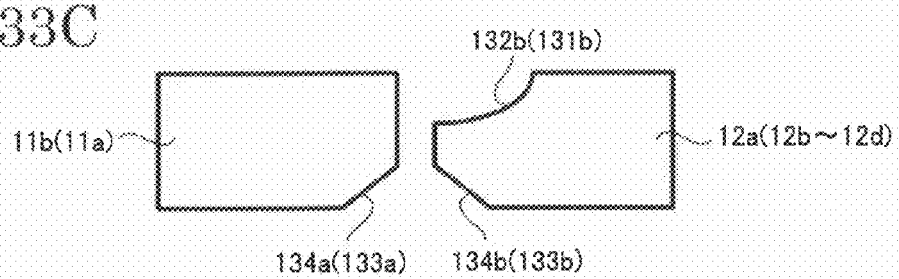
Figure 33D:
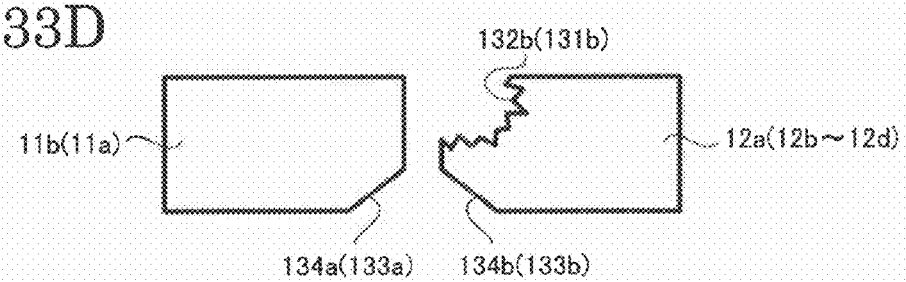
Figure 33E:
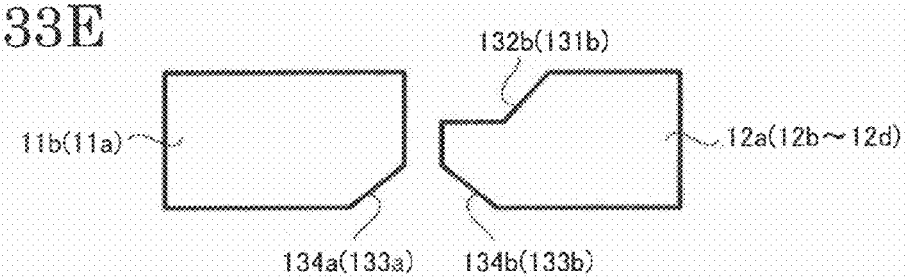
Figure 34A:
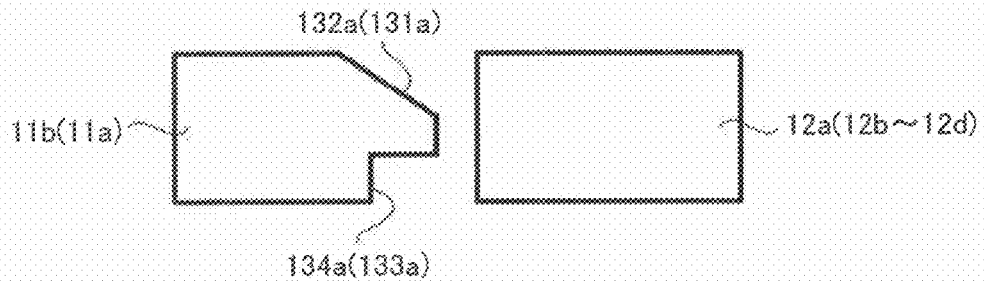
FIG. 34A-FIG. 34D are views showing alternative examples of the shape of a notch portion on the first-surface side when formed in a frame section.
Figure 34B:
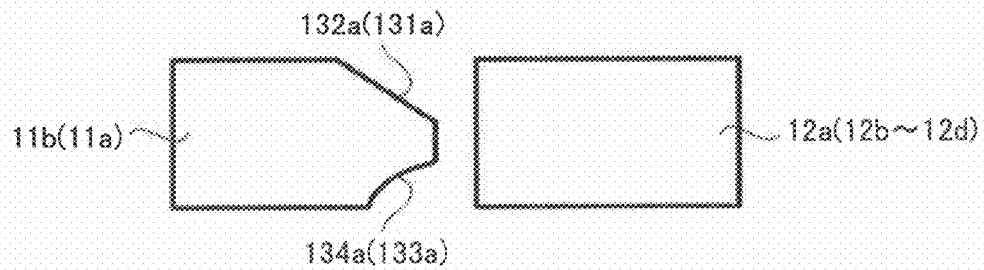
Figure 34C:
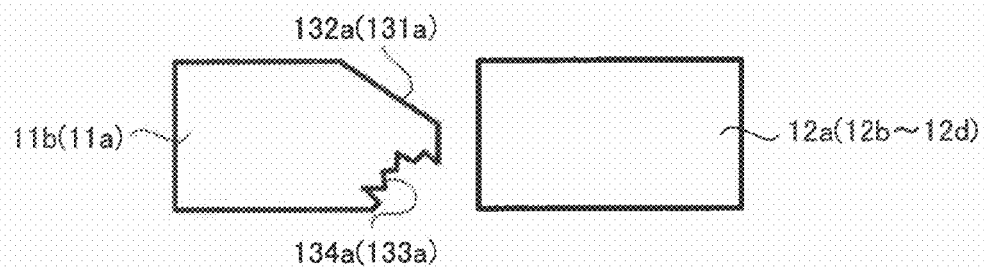
Figure 34D:
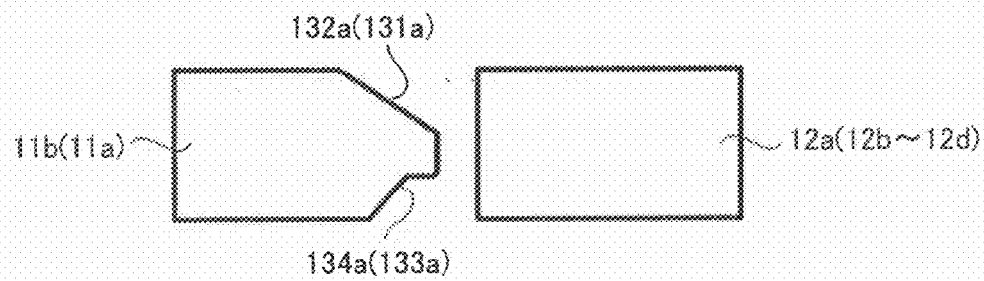
Figure 35A:
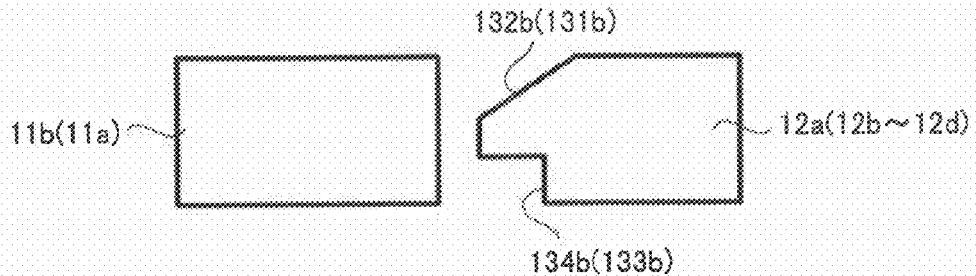
FIG. 35A-FIG. 35D are views showing alternative examples of the shape of a notch portion on the first-surface side when formed in a piece section.
Figure 35B:
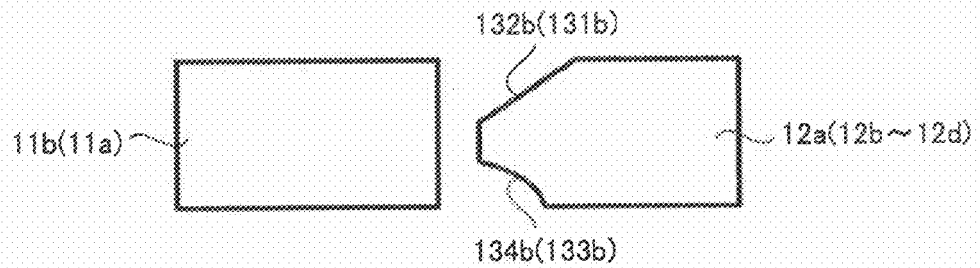
Figure 35C:
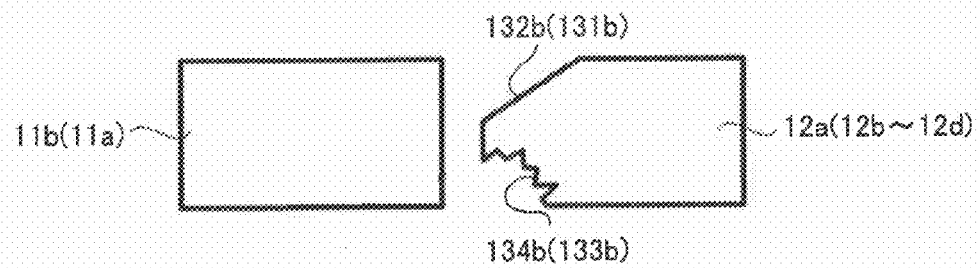
Figure 35D:
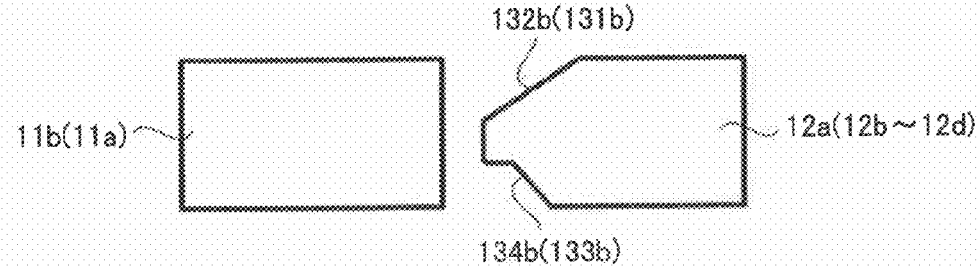

Notch portions (131a, 132a) and cavities (131, 132) are not limited to any specific configurations. For example, as shown in FIG. 32A), the cross-sectional shape of notch portions (131a, 132a) may be such a shape made by a planar surface and a wall surface perpendicular to the planar surface. Alternatively, as shown in FIG. (32B), the cross-sectional shape of notch portions (131a, 132a) may be such a shape made of curved surfaces. Yet alternatively, as shown in FIG. (32C), the cross-sectional shape of notch portions (131a, 132a) may be such a shape made by roughened surfaces (zigzag surfaces) having numerous small cavities or grooves. Yet alternatively, as shown in FIG. (32D), the cross-sectional shape of notch portions (131a, 132a) may be such a shape made with planar surfaces and slanted surfaces. In addition, instead of forming notch portions (131a, 132a) in frame sections (11a, 11b), notch portions (131b, 132b) for forming cavities (131, 132) may be formed in piece sections (12a-12d) as shown in FIGS. (33A-33E).

Figure 36:
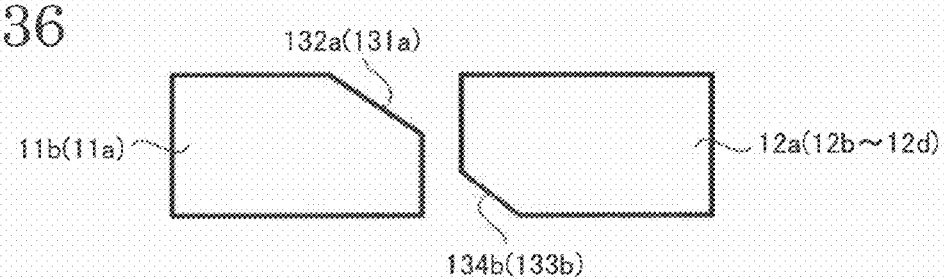
FIG. 36 is a view showing a first example of how to combine a notch portion on the first-surface side and a notch portion on the second-surface side.
Figure 37:
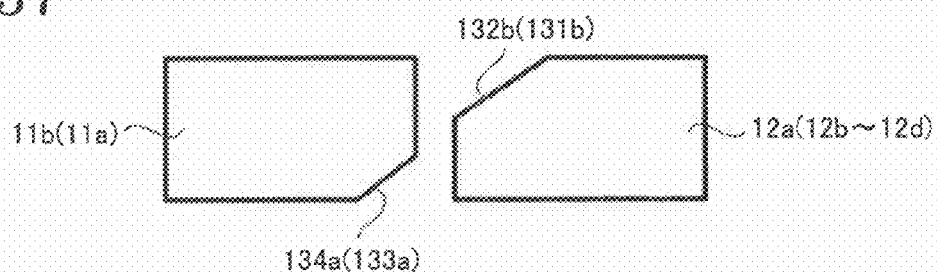
FIG. 37 is a view showing a second example of how to combine a notch portion on the first-surface side and a notch portion on the second-surface side.
Figure 38:
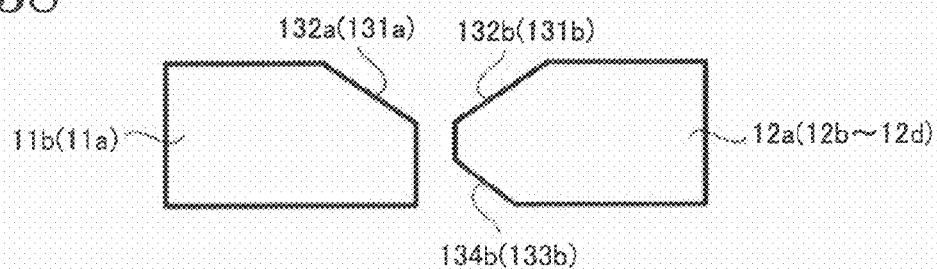
FIG. 38 is a view showing a first example in which notch portions are formed in both a frame section and a piece section.
Figure 39:
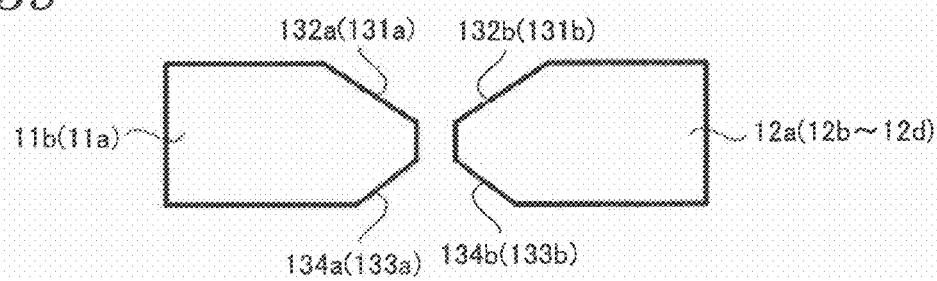
FIG. 39 is a view showing a second example in which notch portions are formed in both a frame section and a piece section.
Figure 40A:
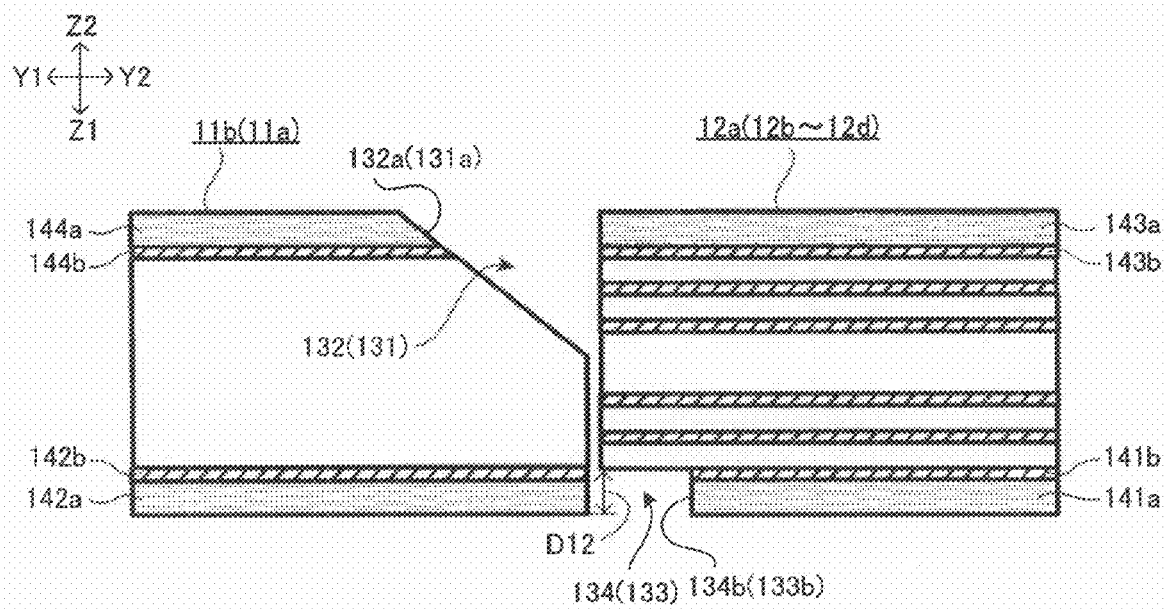
FIG. 40A is a view showing a first example of a notch portion formed by removing a solder-resist layer.
Figure 40B:
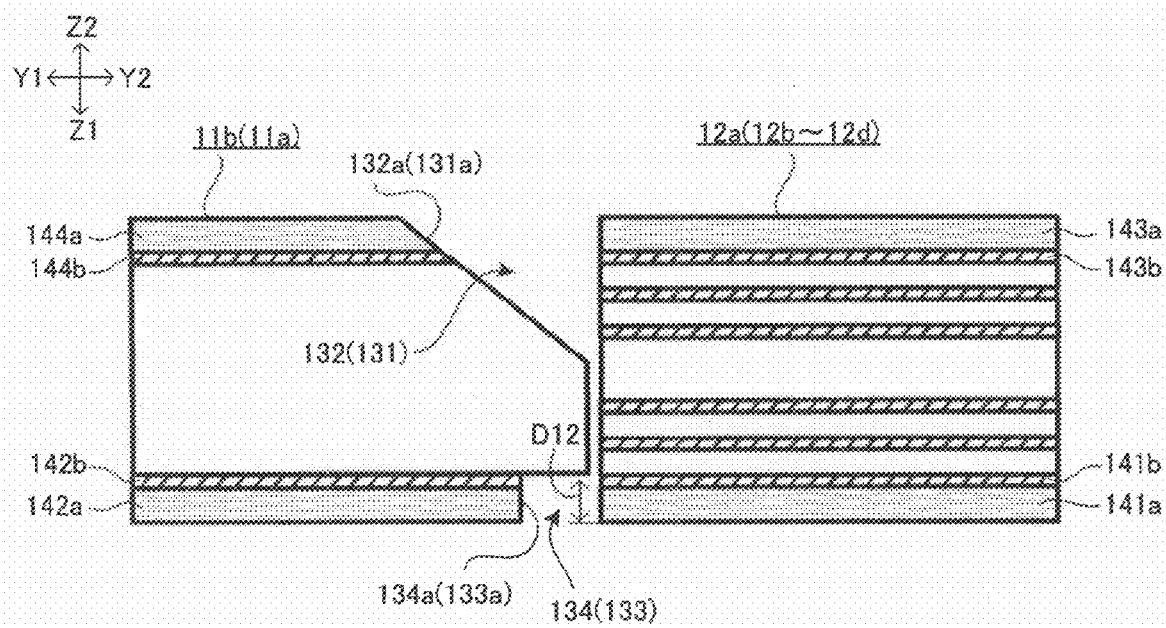
FIG. 40B is a view showing a second example of a notch portion formed by removing a solder-resist layer.

Furthermore, as shown in FIGS. (34A-34D) or (35A-35D), notch portions (133a, 133b, 134a, 134b) and cavities (133, 134) are not limited to any specific configurations. In addition, their structures and the structures shown previously in FIGS. (32A-32D) or (33A-33E) may be combined freely. For example, when forming notch portions (131a, 132a, 133a, 134a) or notch portions (131b, 132b, 133b, 134b) only either in frame sections (11a, 11b) or piece sections (12a-12d), as shown in FIG. 36, for example, it is preferred that notch portions (131a, 132a) be formed in frame sections (11a, 11b), and that notch portions (133b, 134b) be formed in piece sections (12a-12d). Alternatively, as shown in FIG. 37, it is preferred that notch portions (131b, 132b) be formed in piece sections (12a-12d), and that notch portions (133a, 134a) be formed in frame sections (11a, 11b).

As shown in FIGS. (38, 39), notch portions (131a, 131b) and notch portions (132a, 132b) may be formed both in frame sections (11a, 11b) and piece sections (12a-12d).

Notch portions (131a, 131b), notch portions (132a, 132b), notch portions (133a, 133b) or notch portions (134a, 134b) may have different structures from each other. However, instead of forming notch portions both in frame sections (11a, 11b) and piece sections (12a-12d), it is more cost-effective if notch portions are formed only in either set of sections. Especially, since frame sections (11a, 11b) will be generally discarded in the final stage, it is preferred that notch portions be formed in frame sections (11a, 11b).

As shown in FIGS. (40A, 40B), by removing solder-resist layer (141a) or (142a) formed on the surfaces of frame sections (11a, 11b) or piece sections (12a-12d), notch portions (133a, 133b, 134a, 134b) may be formed. For example, by removing at least either outermost wiring layer (141b) and solder-resist layer (141a) or outermost wiring layer (142b) and solder-resist layer (142a) through etching wiring layers and screen-printing solder-resist layers or the like, for example, notch portions (133a, 133b, 134a, 134b) may also be formed.

Figure 41:
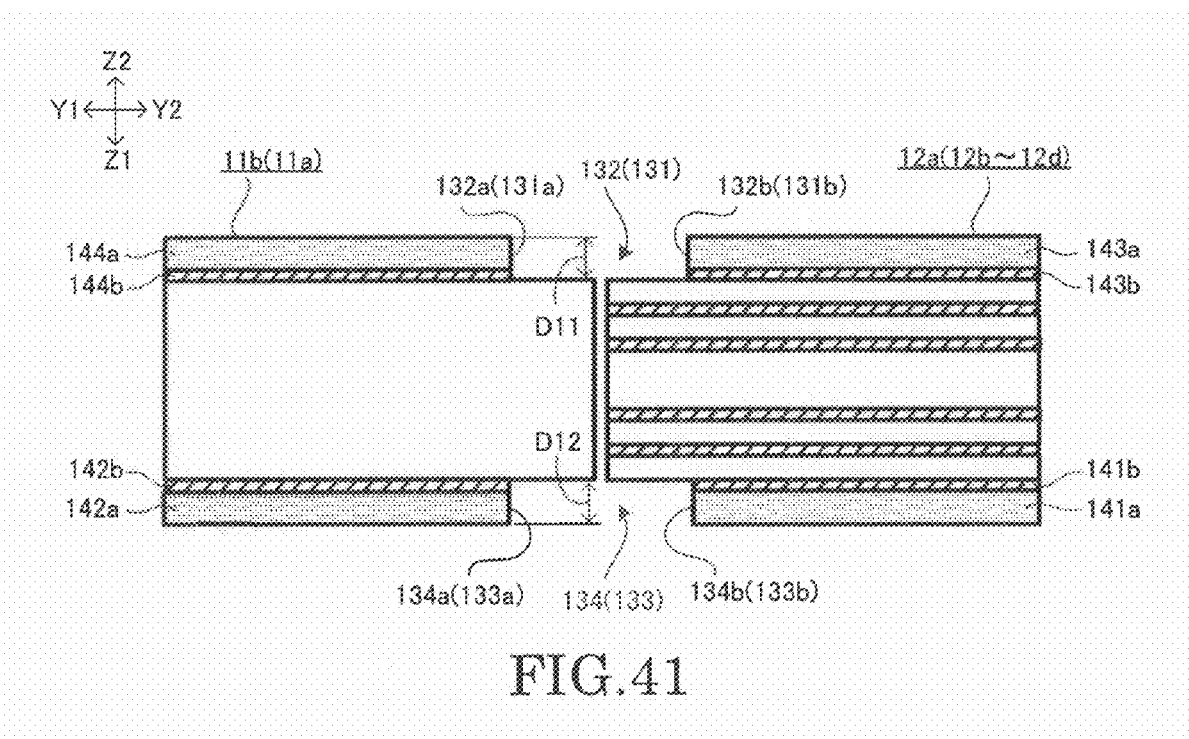
FIG. 41 is a view showing a third example of a notch portion formed by removing a solder-resist layer.

Moreover, as shown in FIG. 41, by removing solder-resist layer (143a) or (144a) formed on the surfaces of frame sections (11a, 11b) or piece sections (12a-12d), notch portions (131a, 131b, 132a, 132b) may be formed. Namely, by removing at least either outermost wiring layer (143b) and solder-resist layer (143a) or outermost wiring layer (144b) and solder-resist layer (144a) through etching wiring layers and screen-printing solder-resist layers or the like, for example, notch portions (131a, 131b, 132a, 132b) may also be formed.

Depth (D12) of cavity 133 or 134 is equivalent to the sum of the thickness of wiring layer (141b) or (142b) and the thickness of solder-resist layer (141a) or (142a). (D12) is set at 50 μm, for example. Also, depth (D11) of cavity 131 or 132 is equivalent to the sum of the thickness of wiring layer (143b) or (144b) and the thickness of solder-resist layer (143a) or (144a). (D11) is also set at 50 μm, for example. Since it is difficult to form thick solder-resist layers, such a method is effective in forming notch portions or cavities where (D11) and (D12) are 100 μm or less, more preferably 50 μm or less.

Figure 42:
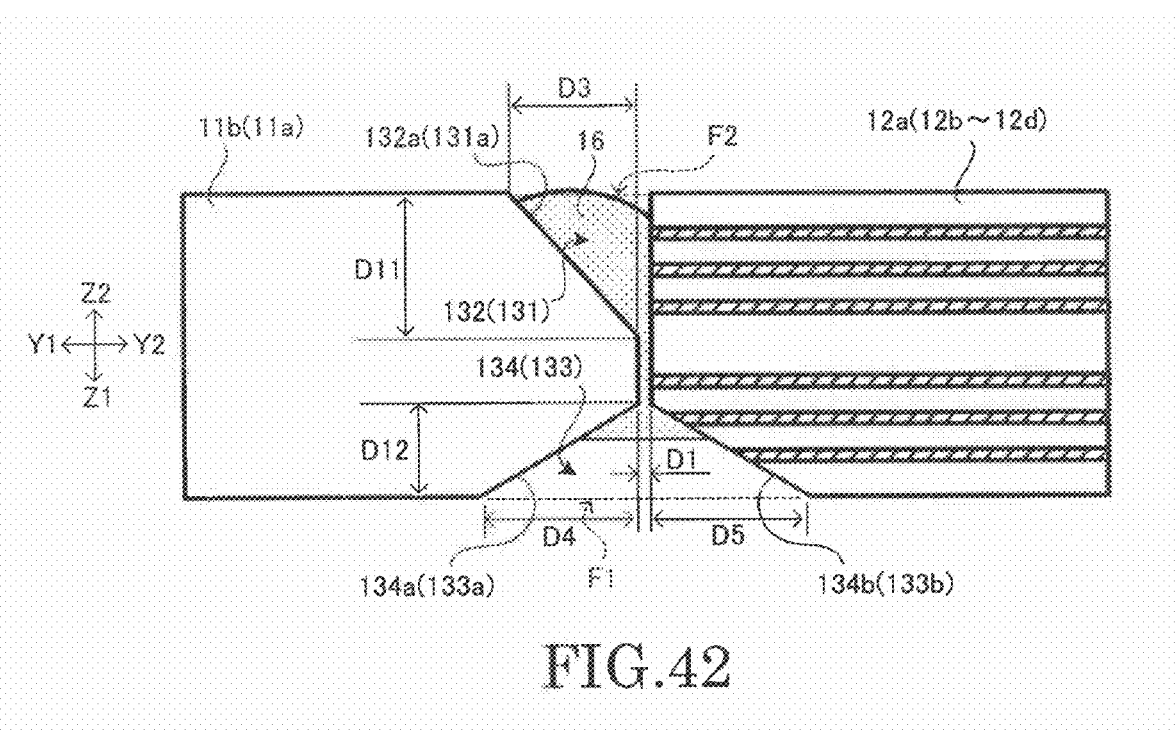
FIG. 42 is a view showing an example in which a frame section is made of a material (insulative substrate) having no laminated copper foil.

The material for frame sections (11a, 11b) is not limited to any specific kind. For example, as shown in FIG. 42, if a material (insulative substrate) on which no copper foil is laminated is used for frame section (11a, 11b), frame section (11a, 11b) may be formed at an even lower cost.

The number of joint portions (14a, 14b) (protruding portions) and joint portions (15a, 15b) (cavities) is not limited to any specific number. The greater the numbers of joint portions (14a, 14b) and joint portions (15a, 15b), the stronger the joint force between frame sections (11a, 11b) and piece sections (12a-12d).

Figure 43:
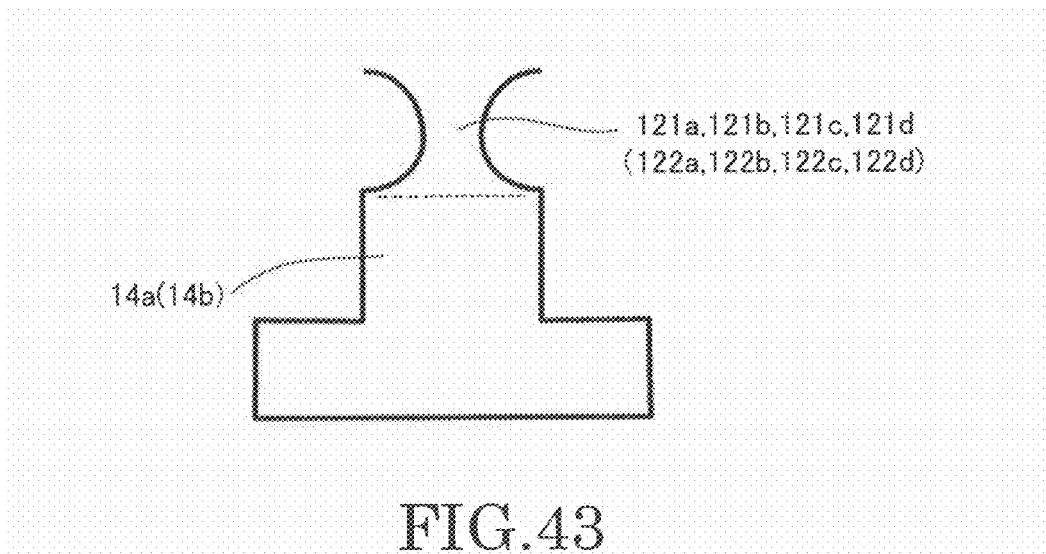
FIG. 43 is a view of a first alternative example showing a planar shape of a joint portion.
Figure 44:
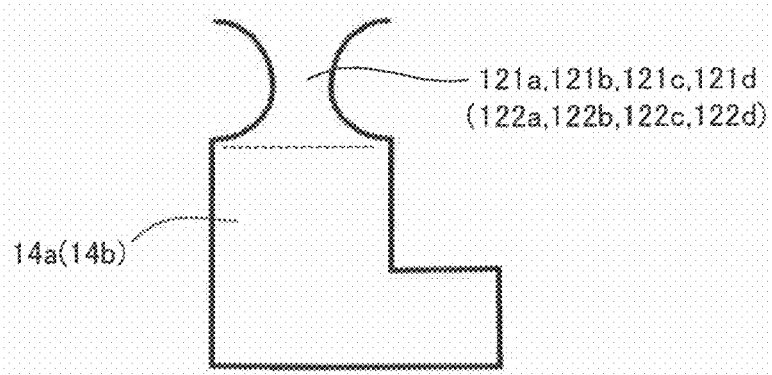
FIG. 44 is a view of a second alternative example showing a planar shape of a joint portion.
Figure 45:
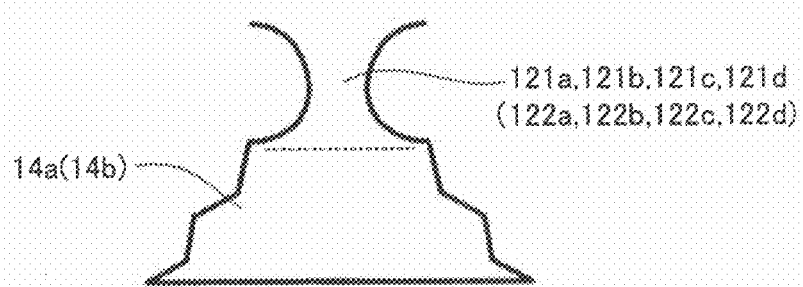
FIG. 45 is a view of a third alternative example showing a plan shape of a joint portion.

The planar shapes of joint portions (14a, 14b) (protruding portions) and joint portions (15a, 15b) (cavities) are not limited to trapezoidal. For example, as shown in FIG. 43 or 44, joint portions (14a, 14b) may be formed to be T-shaped or L-shaped. Also, as shown in FIG. 45, to increase the contact areas with joint portions (15a, 15b), the sides of joint portions (14a, 14b) may be set zigzag, for example. Usually, having joint portions (15a, 15b) formed to correspond to the shape of joint portions (14a, 14b) is effective in strengthening their bonding. However, they may be formed differently. Basically, any configurations may be employed for joint portions (14a, 14b) and joint portions (15a, 15b). However, they are preferred to be formed in such a way that when piece sections (12a-12d) are pulled in a direction parallel to the main surfaces of the board (X-Y plane), joint portions (14a, 14b) will be latched by frame sections (11a, 11b) so that piece sections (12a-12d) will not be detached from frame sections (11a, 11b). However, according to requirements, their configurations may be selected in any type, such as a simple rectangle or circle.

Joint portions (14a, 14b) (protruding portions) may be formed in frame sections (11a, 11b), and joint portions (15a, 15b) (cavities) may be formed in piece sections (12a-12d).

Regarding other elements, the structures (structural elements, measurements, quality, configuration, number of layers, positioning or the like) of frame sections (11a, 11b) or piece sections (12a-12d) may be modified within a scope that does not deviate from the gist of the present invention. For example, frame sections (11a, 11b) may be made of metal such as aluminum.

Figures 46, 47:
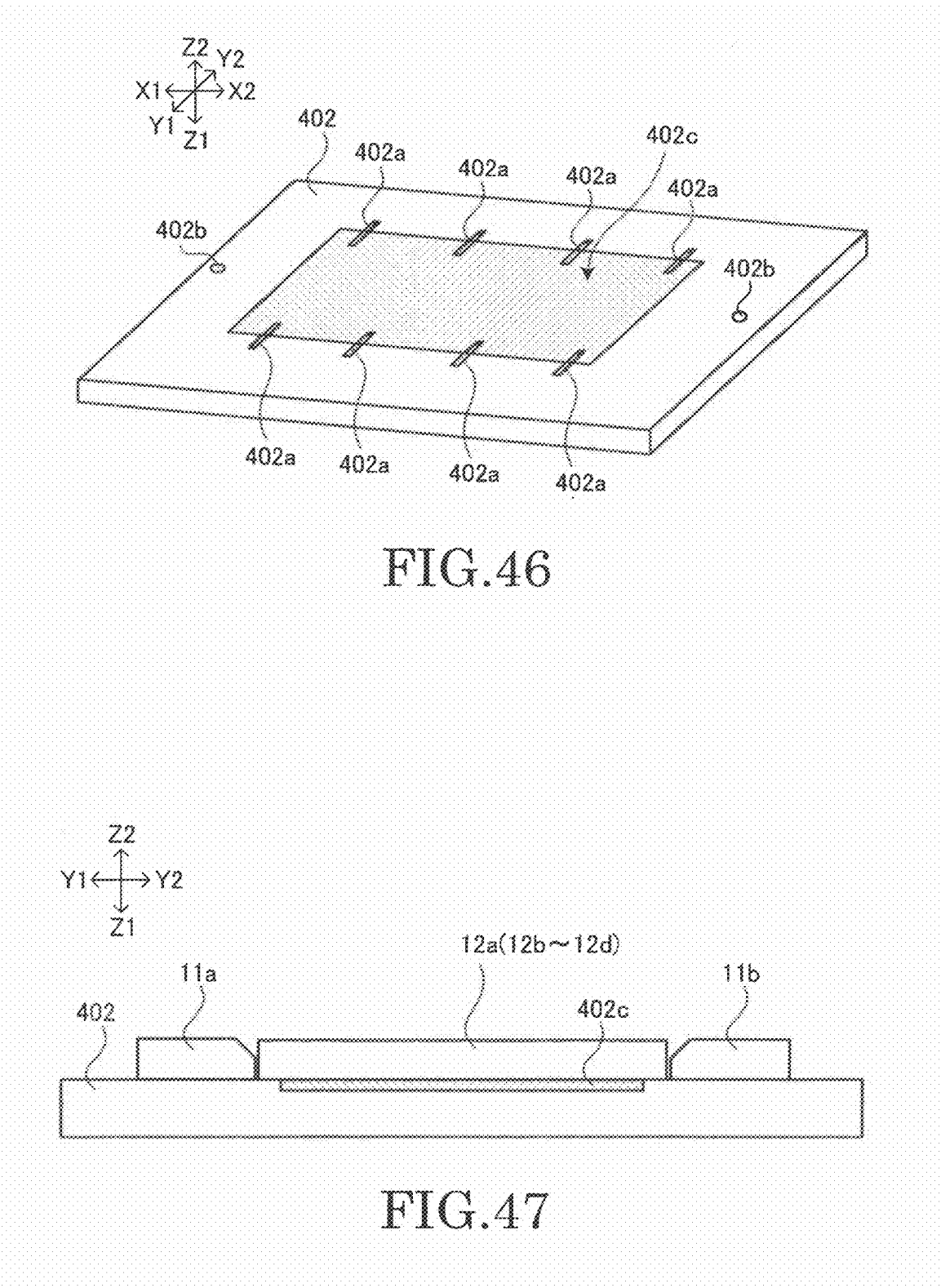
FIG. 46 is a view to illustrate an alternative example of a method for a preliminary fixing.
FIG. 47 is a cross-sectional view to illustrate an alternative example of a method for a preliminary fixing.

Instead of adhesive sheet 301 (FIG. 20), stand 402 with adhesive section (402c) (a partially adhesive board material) may be used as shown in FIG. 46, for example. Part of stand 402 where adhesive section (402c) is located is adhesive. As shown in FIG. 47, for example, adhesive section (402c) is positioned under piece sections (12a-12d) (on the arrow-Z1 side), but is not positioned under frame sections (11a, 11b). Accordingly, using stand 402, only piece sections (12a-12d) may be preliminarily secured by adhesive section (402c). Stand 402 of such an example has through holes (402a) and base holes (402b) the same as adhesive sheet 301.

A method for preliminarily securing piece sections (12a-12d) is not limited to such a method using adhesive sheet 301. Piece sections (12a-12d) may be preliminarily secured by using any other method. For example, instead of adhesive sheet 301, vacuum chucks, electrostatic chucks, magnetic sheets or the like may also be used for preliminarily securing the piece sections through suction power, electrostatic power or magnetic power. However, if magnetic power is used for preliminarily securing piece sections, piece sections (12a-12d) are required to be magnetic.

In the above embodiment, an example was shown in which frame sections (11a, 11b) are arranged after piece sections (12a-12d) are aligned and positioned. However, prior to positioning piece sections (12a-12d), frame sections (11a, 11b) may be aligned and positioned. In the following, with reference to the drawings, an example is described where frame sections (11a, 11b) are aligned using devices (stand 403, separator 404) prior to positioning piece sections (12a-12d).

Figure 48:
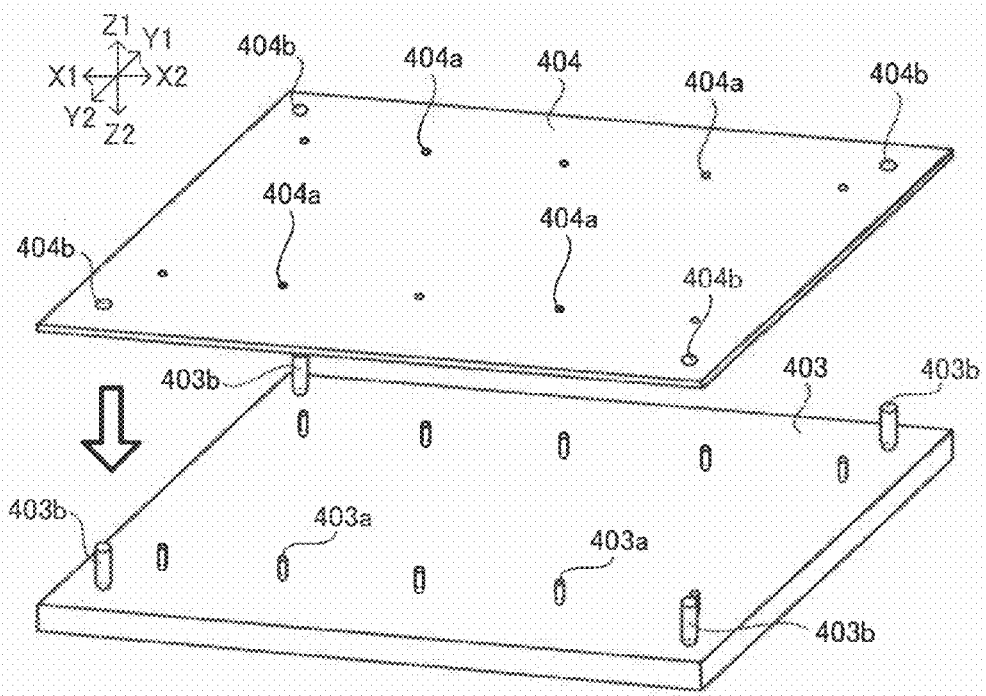
FIG. 48 is a view to illustrate a first step of an example of a method for aligning frame sections.

First, as shown in FIG. 48, stand 403 and separator 404 are prepared. Stand 403 has pins (403a) to be inserted into holes (110a) (FIG. 1) of frame sections (11a, 11b) in areas to position frame sections (11a, 11b), and has pins (403b) in its four corners. On the other hand, separator 404 has holes (404a) in spots corresponding to pins (403a), and holes (404b) in spots corresponding to pins (403b). Pins (403a, 403b) are inserted into holes (404a, 404b) by hand, for example. Accordingly, separator 404 is installed on stand 403.

Figure 49:
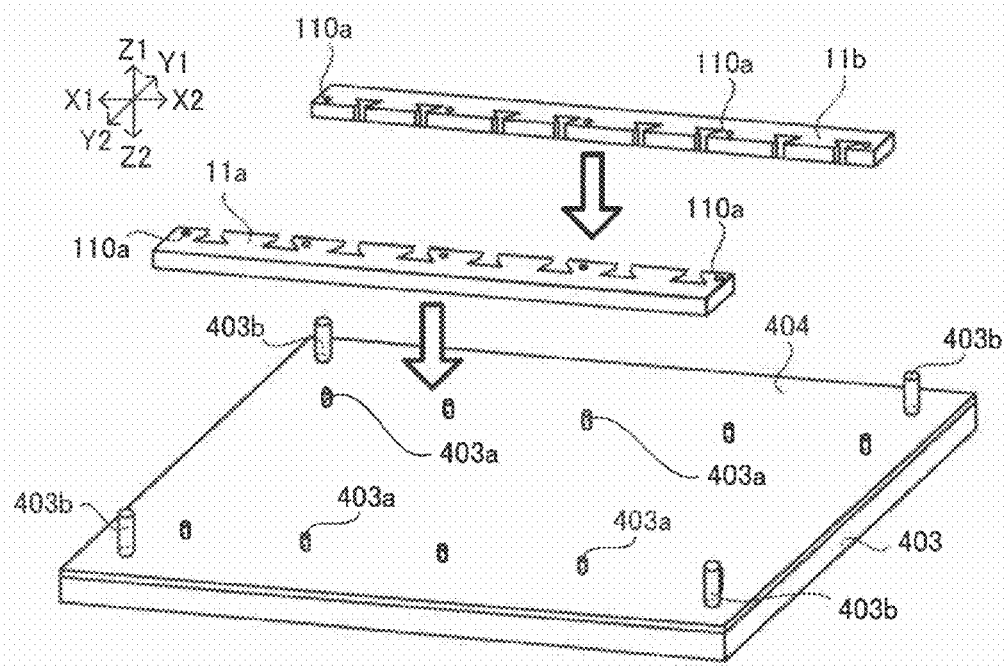
FIG. 49 is a view to illustrate a second step of an example of a method for aligning frame sections.

Next, as shown in FIG. 49, frame sections (11a, 11b) are positioned on separator 404 by hand, for example. During that time, pins (403a) protruding from separator 404 are inserted into holes (110a) of frame sections (11a, 11b). Pins (403a) will not protrude from holes (110a).

Figure 50:
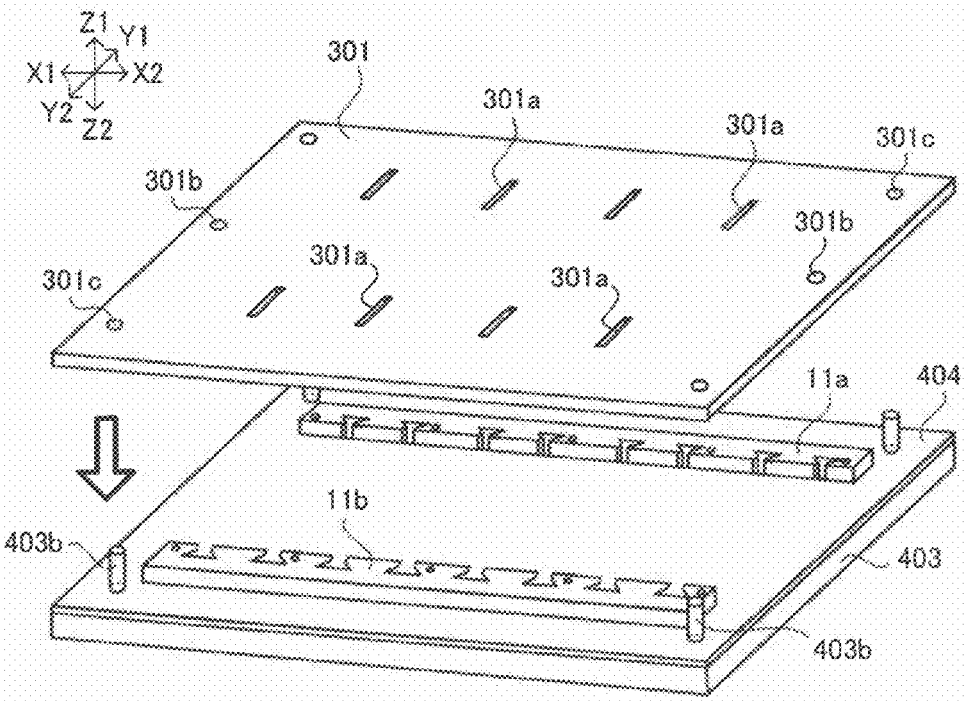
FIG. 50 is a view to illustrate a third step of an example of a method for aligning frame sections.

Then, as shown in FIG. 50, adhesive sheet 301 having holes (301c) in its four corners is mounted onto frame sections (11a, 11b) by hand, for example. Then, by pressing appropriately, frame sections (11a, 11b) are adhered to adhesive sheet 301. During that time, pins (403b) protruding from separator 404 are inserted into holes (301c) of adhesive sheet 301.

Figure 51:
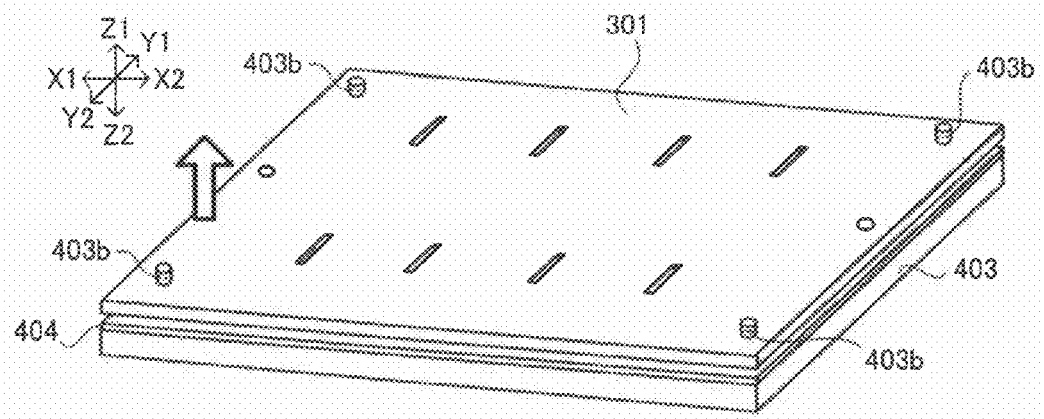
FIG. 51 is a view to illustrate a fourth step of an example of a method for aligning frame sections.
Figure 52:
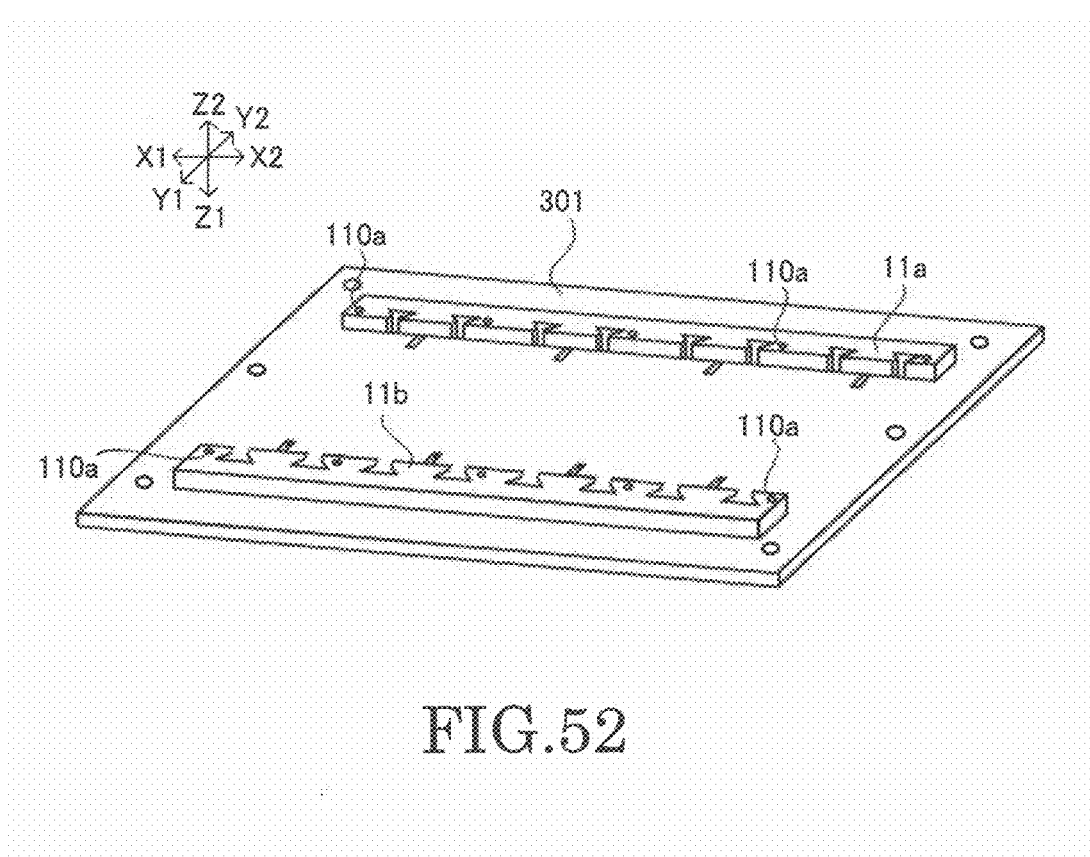
FIG. 52 is a view showing the frame sections aligned by the method shown in FIGS. (48-51), and positioned on an adhesive sheet.

Then, as shown in FIG. 51, adhesive sheet 301 is removed from the devices (stand 403, separator 404) by hand, for example. By doing so, as shown in FIG. 52, frame sections (11a, 11b) are preliminarily secured to predetermined positions on adhesive sheet 301.

According to a method using such devices, frame sections (11a, 11b) may be easily aligned by hand. Piece sections (12a-12d) may also be aligned using the same devices. However, for aligning with a high degree of accuracy, it is preferred that frame sections (11a, 11b) and piece sections (12a-12d) be aligned using automatic alignment equipment (see FIG. 20) with camera 304, mounter 303 or the like.

To simplify the manufacturing procedures, the above embodiment showed multi-piece board 10 with only piece sections (12a-12d) having the same structure. However, the present invention is not limited to such. For example, the present invention may be employed even if piece sections (12a-12d) have different structures. In such a case, piece sections (12a-12d) may be manufactured using different panels.

The order of steps in the above embodiment is not limited to those orders and contents shown in the flowcharts. Such orders and contents may be modified in a scope that does not deviate from the gist of the present invention. In addition, some steps may be omitted according to requirements.

As for a router, an alignment router (a router with alignment functions) with a higher degree of processing accuracy may be used rather than a regular router. However, a regular router is more effective than an alignment router in terms of processing speed.

Obviously, numerous modifications and variations of the present invention are possible in light of the above teachings. It is therefore to be understood that within the scope of the appended claims, the invention may be practiced otherwise than as specifically described herein.

What is claimed is:

1. A multi-piece board, comprising:
   a frame; and
   a plurality of wiring boards connected to the frame,
   wherein the plurality of wiring boards includes a wiring board having a joint portion engaged to a joint portion of the frame such that the joint portion of the frame and the joint portion of the wiring board form a clearance, at least one of the frame and the wiring board has the joint portion having a first notch portion formed on a first surface of the joint portion adjacent to the clearance and a second notch portion formed on a second surface on an opposite surface side with respect to the first surface adjacent to the clearance such that the first notch portion and the second notch portion are extending to the clearance between the joint portion of the frame and the joint portion of the wiring board, and the clearance is filled with an adhesive agent.

2. The multi-piece board according to claim 1, wherein at least one of the first notch portion and the second notch portion is formed by removing a solder-resist layer formed on a surface of the frame or the wiring board.

3. The multi-piece board according to claim 1, wherein one of the frame and the wiring board has the joint portion having the first notch portion and the second notch portion, and the second notch portion forms a cavity with the joint portion of the other one of the frame and the wiring board such that the cavity has a width which increases toward the second surface of the joint portion.

4. The multi-piece board according to claim 1, wherein one of the frame and the wiring board has the joint portion having the first notch portion and the second notch portion, and the other one of the frame and the wiring board has the joint portion having a notch portion which forms a cavity with the first notch portion of the joint portion of the one of the frame and the wiring board such that the cavity has a width which increases toward the first surface of the joint portion.

5. The multi-piece board according to claim 1, wherein one of the frame and the wiring board has the joint portion having the first notch portion and the second notch portion, and the first notch portion form a cavity with the joint portion of the other one of the frame and the wiring board such that the cavity has a width which increases toward the first surface of the joint portion.

6. The multi-piece board according to claim 1, wherein one of the frame and the wiring board has the joint portion having the first notch portion and the second notch portion, and the other one of the frame and the wiring board has the joint portion having a notch portion which forms a cavity with the first notch portion of the joint portion of the one of the frame and the wiring board such that the cavity has a width which increases toward the first surface of the joint portion.

7. The multi-piece board according to claim 1, wherein the adhesive agent is a UV-curable adhesive agent.

8. The multi-piece board according to claim 1, wherein the frame and the plurality of wiring boards are made with wiring boards having a different number of layers.

9. A method for manufacturing a multi-piece board, comprising:

forming a frame having a joint portion;
   forming a wiring board having a joint portion which engages to the joint portion of the frame such that the joint portion of the frame and the joint portion of the wiring board form a clearance;
   positioning the frame and the wiring board such that the joint portion of the frame and the joint portion of the wiring board are engaged and form the clearance;
   forming a first notch portion in the joint portion of at least one of the frame and the wiring board on a first surface of the joint portion of the at least one of the frame and the wiring board adjacent to the clearance such that the first notch portion extends to the clearance;
   forming a second notch portion in the joint portion of the at least one of the frame and the wiring board on a second surface on an opposite surface side with respect to the first surface adjacent to the clearance such that the second notch portion extends to the clearance; and
   injecting an adhesive agent from the first notch portion into the clearance between the joint portion of the frame and the joint portion of the wiring board.

10. The method for manufacturing a multi-piece board according to claim 9, wherein the forming of at least one of the first notch portion and the second notch portion comprises removing a solder-resist layer formed on a surface of the joint portion of the at least one of the frame and the wiring board.

11. The method for manufacturing a multi-piece board according to claim 9, wherein the adhesive agent is a UV-curable adhesive agent.

12. The method for manufacturing a multi-piece board according to claim 9, wherein one of the frame and the wiring board has the joint portion having the first notch portion and the second notch portion, and the forming of the second notch portion comprises forming the second notch portion which forms a cavity with the joint portion of the other one of the frame and the wiring board such that the cavity has a width which increases toward the first surface of the joint portion.

13. The method for manufacturing a multi-piece board according to claim 9, wherein one of the frame and the wiring board has the joint portion having the first notch portion and the second notch portion, a notch portion is formed in the joint portion of the other one of the frame and the wiring board, and the second notch portion in the joint portion of the one of the frame and wiring board forms a cavity with the notch portion in the joint portion of the other one of the frame and the wiring board such that the cavity has a width which increases toward the first surface of the joint portion.

14. The method for manufacturing a multi-piece board according to claim 9, wherein one of the frame and the wiring board has the joint portion having the first notch portion and the second notch portion, the forming of the first notch portion comprises forming a first notch portion which forms a cavity with the joint portion of the other one of the frame and the wiring board such that the cavity has a width which increases toward the first surface of the joint portion.

15. The method for manufacturing a multi-piece board according to claim 9, wherein one of the frame and the wiring board has the joint portion having the first notch portion and the second notch portion, a notch portion is formed in the joint portion of the other one of the frame and the wiring board, and the first notch portion in the joint portion of the one of the frame and wiring board forms a cavity with the notch portion in the joint portion of the other one of the frame and the wiring board such that the cavity has a width which increases toward the first surface of the joint portion.

16. The method for manufacturing a multi-piece board according to claim 9, wherein the frame and the wiring board are made with wiring boards having a different number of layers.

17. The multi-piece board according to claim 1, wherein one of the frame and the wiring board has the joint portion having the first notch portion and the second notch portion, and the other one of the frame and the wiring board has the joint portion having a notch portion which forms a cavity with the first notch portion of the joint portion of the one of the frame and the wiring board such that the cavity has a depth which is smaller than a depth of the second notch portion and has a width which increases toward the first surface of the joint portion.

18. The multi-piece board according to claim 1, wherein one of the frame and the wiring board has the joint portion having the first notch portion and the second notch portion, the first notch portion and the second notch portion are formed such that the first notch portion and the second notch portion are not directly connected to each other, and the other one of the frame and the wiring board has the joint portion having a notch portion which forms a cavity with the first notch portion of the joint portion of the one of the frame and the wiring board such that the cavity has a depth which is smaller than a depth of the second notch portion and has a width which increases toward the first surface of the joint portion.

19. The method for manufacturing a multi-piece board according to claim 9, wherein one of the frame and the wiring board has the joint portion having the first notch portion and the second notch portion, a notch portion is formed in the joint portion of the other one of the frame and the wiring board, and the first notch portion in the joint portion of the one of the frame and wiring board forms a cavity with the notch portion in the joint portion of the other one of the frame and the wiring board such that the cavity has a depth which is smaller than a depth of the second notch portion and has a width which increases toward the first surface of the joint portion.

20. The method for manufacturing a multi-piece board according to claim 9, wherein one of the frame and the wiring board has the joint portion having the first notch portion and the second notch portion, the first notch portion and the second notch portion are formed such that the first notch portion and the second notch portion are not directly connected to each other, a notch portion is formed in the joint portion of the other one of the frame and the wiring board, and the first notch portion in the joint portion of the one of the frame and wiring board forms a cavity with the notch portion in the joint portion of the other one of the frame and the wiring board such that the cavity has a depth which is smaller than a depth of the second notch portion and has a width which increases toward the first surface of the joint portion.

* * * * *